(12) United States Patent
Yamaji

(10) Patent No.: US 8,269,305 B2
(45) Date of Patent: Sep. 18, 2012

(54) HIGH-VOLTAGE SEMICONDUCTOR DEVICE

(75) Inventor: Masaharu Yamaji, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 215 days.

(21) Appl. No.: 12/813,178

(22) Filed: Jun. 10, 2010

(65) Prior Publication Data
US 2010/0314710 A1    Dec. 16, 2010

(30) Foreign Application Priority Data

Jun. 10, 2009    (JP) ................................. 2009-139123

(51) Int. Cl.
*H01L 27/06* (2006.01)
(52) U.S. Cl. ................................. 257/501; 257/E27.011
(58) Field of Classification Search .................. 257/501, 257/E27.011
See application file for complete search history.

(56) References Cited

U.S. PATENT DOCUMENTS

| | | | | |
|---|---|---|---|---|
| 5,477,175 | A * | 12/1995 | Tisinger et al. | 327/143 |
| 7,306,999 | B2 * | 12/2007 | Hall et al. | 438/329 |
| 2002/0093052 | A1 * | 7/2002 | Masuda | 257/347 |
| 2004/0119132 | A1 | 6/2004 | Akiyama | |
| 2006/0087343 | A1 | 4/2006 | Himi et al. | |
| 2006/0249807 | A1 | 11/2006 | Akiyama | |
| 2007/0013022 | A1 * | 1/2007 | Shimizu | 257/500 |

FOREIGN PATENT DOCUMENTS

| | | |
|---|---|---|
| JP | 2006-148058 A | 6/2006 |
| JP | 2006-313828 A | 11/2006 |
| JP | 2007-281035 A | 10/2007 |
| JP | 4020195 B2 | 12/2007 |
| JP | 2008-028350 A | 2/2008 |

OTHER PUBLICATIONS

Sedra et al. "Microelectronic Circuits." 1998, Oxford University Press, Inc., 4th Ed. pp. 356-361.*

* cited by examiner

*Primary Examiner* — Minh-Loan T Tran
*Assistant Examiner* — Wensing Kuo
(74) *Attorney, Agent, or Firm* — Rossi, Kimms & McDowell LLP

(57) ABSTRACT

Aspects of the present invention provide a high-voltage semiconductor device and a high voltage integrated circuit device while minimizing or eliminating the need for the addition of back surface steps. Aspects of the invention provide a high-voltage semiconductor device that achieves, low voltage driving and quick response by way of stable high voltage wiring and a low ON voltage. In some aspects of the invention, a high-voltage semiconductor device can include a semiconductor layer is formed on a support substrate interposing an embedded oxide film therebetween. A high potential side second stage transistor and a low potential side first stage transistor surrounding the second stage transistor are formed on the surface region of the semiconductor layer. The source electrode of the second stage transistor is connected to the drain electrode of the first stage transistor. A drain electrode of the second stage transistor is connected to a drain pad.

10 Claims, 16 Drawing Sheets

HIGH-VOLTAGE SEMICONDUCTOR DEVICE

CROSS-REFERENCE TO RELATED APPLICATION

This application claims the benefit under 35 U.S.C. §119 (a)-(d) of Japanese Patent Application No. 2009-139123, filed on Jun. 10, 2009, currently pending, the contents of which are incorporated herein by reference.

BACKGROUND

1. Field of the Invention

The present invention relates to high-voltage semiconductor devices using an SOI (silicon on insulator) substrate, the devices being mainly intended for use in a power conversion integrated circuit represented by an HVIC (high voltage integrated circuit). The devices can be used for an LDMOSFET (lateral double diffused MOSFET) of a high withstand voltage class in the range of 100 V to 1,200 V.

2. Description of the Related Art

Recently, with a demand for high withstand voltage of a power IC containing a high withstand voltage element, SOI substrates are attracting attention, which allow complete isolation between elements by trench dielectric isolation and dielectric insulation layers. A high withstand voltage power conversion integrated circuit formed on an SOI substrate has advantages of preventing malfunction due to a parasitic element upon a switching process and interference due to a noise, and reduction of parasitic capacitance. Since the dielectric isolation by trenches can be applied to an edge structure and a high voltage junction termination (HVJT) structure of the devices in the integrated circuit, an effect of chip size shrink of the integrated circuit itself can also be expected.

FIGS. 11(a) and 11(b) are circuit diagrams of an example using a conventional HVIC. FIG. 11(a) is a circuit diagram of a resonance type half bridge power supply, and FIG. 11(b) is a block diagram showing an internal construction of the HVIC of FIG. 11(a). As shown in FIG. 11(a), the conventional resonance type half bridge power supply comprises an HVIC 150, output terminals of which are connected to MOSFETs 11 and 12 with wirings. The HVIC 150 gives driving signals to the MOSFETs 11 and 12 to drive the MOSFETs 11 and 12.

A drain terminal of the high potential side MOSFET 11 in FIG. 11(a) is connected to a first wiring 33. The first wiring 33 is subjected to a high dc voltage of from 400 V to 500 V. A source terminal of the low potential side MOSFET 22 is connected to the ground (referred to as a "GND" in the following description). A source terminal of the high potential side MOSFET 11 and a drain terminal of the low potential side MOSFET 22 are connected by a second wiring 44. A bootstrap circuit is constructed by a bootstrap diode 55 and a capacitor 66 and is a power source for a floating reference gate drive circuit 23 of the HVIC 150 of FIG. 11(b).

An electric potential of the wiring 44 varies between GND and Vdd corresponding to switching operation of the MOSFET 11 and the MOSFET 22, in which Vdd is an electric potential of the high potential side of the high voltage power supply of FIG. 11(a) and GND is an electric potential of the low potential side. Therefore, a floating reference gate drive circuit must be provided in order to drive the high potential side MOSFET 11, the floating reference gate drive circuit driving the gate of the MOSFET 11 on a base potential that varies between GND and Vdd. In addition, a level shift circuit 24 must be provided between the floating reference gate drive circuit and a control circuit of a low potential base circuit (a GND base circuit) with a base potential of the GND level. Thus, the HVIC 150 provided with a floating reference gate drive circuit 23 and a level shift circuit 24 has been proposed.

As shown in FIG. 11(b), the HVIC 150 comprises a control circuit 21, a driving circuit 25, the floating reference gate drive circuit 23, and the level shift circuit 24. The output terminals of the floating reference gate drive circuit 23 and the driving circuit 25 each having a gate driving circuit are electrically connected to gate electrodes of the high potential side MOSFET 11 and the low potential side MOSFET 22, respectively, with a wiring. The control circuit 21 and the driving circuit 25 are GND base circuits 27 with a base potential of the GND.

The control circuit 21 generates control signals for turning the MOSFETs 11 and 12 ON/OFF (the signals being referred to as ON/OFF signals). The control circuit 21 receives an alarm signal and a warning signal from the floating reference gate drive circuit 23.

The floating reference gate drive circuit 23 gives a driving signal to the gate terminal of the high potential side MOSFET 11 connecting to the Vdd side and operates based on a potential of an output voltage that varies according to switching of the MOSFET. The floating reference gate drive circuit 23 receives an ON/OFF signal for the MOSFET generated by the control circuit 21 and raised by the level shift circuit 24, and turns the high potential side MOSFET 11 ON/OFF according to the received ON/OFF signal.

The floating reference gate drive circuit 23 further has functions of temperature detection, overcurrent protection, and low voltage protection, and turns the high potential side MOSFET 11 OFF according to the detected information. An alarm signal and a warning signal based on the detected information are, after level reduction by the level shift circuit 24, sent to the control circuit 21.

The driving circuit 25 receives an ON/OFF signal for the low potential side MOSFET 22 generated by the control circuit 21 and turns the MOSFET 22 ON/OFF according to the received ON/OFF signal.

The level shift circuit 24 transforms the ON/OFF signal for the MOSFET 11 generated by the control circuit 21 from signal with a GND base level to a signal with a floating reference level higher than the GND level. The level shift circuit 24 outputs the transformed signal to the floating reference gate drive circuit 23.

The level shift circuit 24 comprises, for raising the base level, a high withstand voltage NMOSFET and a level shift resistor connecting to a drain terminal of the high withstand voltage NMOSFET. The level shift circuit 24 also comprises, for reducing the base level, a high withstand voltage PMOSFET and a level shift resistor connecting to a drain terminal of the high withstand voltage PMOSFET. The level shift circuit 24 can have a construction functioning solely for raising the base level.

The HVIC 150 of FIG. 11(b) is formed by integrating the control circuit 21, the floating reference gate drive circuit 23, the level shift circuit 24, and the driving circuit 25 whole on a single semiconductor substrate. There can be other cases, in one of which only the level shift circuit 24 and the floating reference gate drive circuit 23 are integrated on the same semiconductor substrate. In another case, the MOSFET 11 and the MOSFET 22 are also integrated on the same semiconductor substrate that has the HVIC 150.

FIG. 16 is a sectional view of an essential part of a conventional high-voltage semiconductor device. The conventional high withstand voltage semiconductor device 950 of FIG. 16 can be used for a high withstand voltage NMOSFET for raising the base level in the level shift circuit 24 of FIG. 11(*b*).

The high-voltage semiconductor device 950 comprises a support substrate 900, a dielectric layer 901 provided on the support substrate 900, and a semiconductor substrate of an n− type semiconductor layer 902 provided on the dielectric layer 901. The dielectric layer 901 performs dielectric isolation between the support substrate 900 and the n− type semiconductor layer 902. Lateral dielectric isolation in the n− type semiconductor layer 902 is accomplished by trench dielectric isolation carried out by a silicon oxide film 904 embedded in a trench 903 formed in the n− type semiconductor layer 902. The trench dielectric isolation partitions the n− type semiconductor layer 902. In a predetermined region of the partitioned n− type semiconductor layer 902, which functions as a drift drain region 902, formed are: a high concentration drain n+ layer 913 and an n type buffer layer 912 with higher resistivity than that of the drain n+ layer 913 disposed at the center in the upper surface region of the drift drain region 902; and a p type well diffusion layer 911 separated from and surrounding the n type buffer layer 912 and a source n+ layer 914 in the p type well diffusion layer 911. A gate electrode 910 is provided over the source n+ layer 914, the p type well diffusion layer 911, and the drift drain region 902 intercalating an insulation film. The source n+ layer 914 and the drain n+ layer 913 have a source electrode 908 and a drain electrode 909 formed on the respective n+ layers. The source electrode 908 and the drain electrode 909 are insulated from each other by a field oxide film 905, an interlayer dielectric film (an ILD film) 906, and a passivation film 907.

The source electrode 908 for the source n+ layer 914 and the drain electrode 909 for the drain n+ layer 913 are extending from one another over the drift drain region 902 to form a field plate electrode.

When the support substrate 900, the source electrode 908, and the gate electrode 910 are fixed to the ground potential and a positive bias voltage is applied to the drain electrode 909, a depletion layer expands from a pn junction between the p type well diffusion layer 911 and the n− type semiconductor layer 902 of the semiconductor device 950. At the same time, a depletion layer also expands from an interface between the dielectric layer 901 and the n− type semiconductor layer 902 because the support substrate 900 is fixed to the ground potential. The both lateral and vertical expansion of depletion layer in the n− type semiconductor layer 902 mitigates the surface electric field in the drift drain region 902.

This effect is generally called a RESURF effect (a reduced surface field effect).

Design of the high-voltage semiconductor device 950 is conducted so that the surface electric field is mitigated, electric field concentration at the pn junction is restrained, and avalanche breakdown at the semiconductor substrate surface is avoided even on application of high voltage on the drain electrode 909, by means of taking a sufficiently long distance Ld between the n type buffer layer 912 and the p type well diffusion layer 911 in the drift drain region 902, adjusting an impurity concentration optimum, and optimizing the length of extension of the field plate electrode.

In this condition, an avalanche breakdown takes place at the interface between the drift drain region 902 and the dielectric layer 901. A breakdown voltage Vbr of a high-voltage semiconductor device that fulfills the RESURF condition is represented by the following formula obtained by transforming Poisson equation.

[Mathematical Formula 1]

$$V_{br}=E_{cr} \times (d/2+T_{ox} \times \in_{si}/\in_{ox}) \quad (1)$$

in which Ecr is a critical electric field, d is a thickness of the n− semiconductor layer 902 (in μm), and Tox is a thickness of the dielectric layer 901 (in μm). In the case the n− type semiconductor layer 902 is formed of silicon and the dielectric layer 901 is formed of a silicon oxide film, the breakdown voltage Vbr is 750 V taking specific values of Ecr=3E5 V/cm, d=20 μm, Tox=5 μm, $\in_{Si}$=11.7, and $\in_{ox}$=3.9.

A breakdown voltage generally required by a level shifter and a bootstrap diode mounted on an HVIC is at least 750 V in a product specification of 600 V rating, considering a main power supply voltage Vdd of a high voltage of 400 V, scattering of resistivity of the n-type semiconductor layer 902, scattering of thickness in processing the dielectric layer 901, and further, requirement for the breakdown voltage of the level sifter and the bootstrap diode that must be equivalent or higher than an actual breakdown voltage of the power MOSFET or an IGBG to be controlled by the HVIC. For an HVIC of an 800 V rating, which is used in driving a motor or an inverter, a main power supply voltage Vdd is a higher voltage of about 500 V. As a result, a level shifter of a high withstand voltage NMOSFET 950 that is a level shifter, needs a source-drain withstand voltage of about 1,000 V.

The Mathematical Formula 1 indicates that a high withstand voltage of a high-voltage semiconductor device can be attained by increasing the thickness d of the n− type semiconductor layer 902 or the thickness Tox of the dielectric layer 901. The thickness d of the n-type semiconductor layer 902 has restrictions in the manufacturing processes including etching and oxidation film-embedding in the trench for laterally partitioning function elements on the n− type semiconductor layer 902. Therefore, a practical thickness d is in the range of 10 to 20 μm. The thickness Tox of the dielectric layer 901 also has a problem of rise of an SOI substrate cost because of a problem of large warp of the wafer in the IC production process for a thick SOI substrate with a laminated construction and because of increase in deposition time of dielectric layer 901 using a high temperature furnace. In addition, a thick dielectric layer 901 diminishes expansion of a depletion layer from the junction between the dielectric layer 901 and the n− type semiconductor layer 902, decreasing the RESURF effect. Thus, an electric field on the surface of the high-voltage semiconductor device becomes severe and the withstand voltage decreases. Consequently, reality in mass production is lost in an SOI substrate with a dielectric layer composed of a silicon oxide film having a thickness not smaller than Tox=6 μm, in consideration of a withstand voltage, a substrate cost, and wafer warping.

As a consequence, in order to meet the high withstand voltage requirement by industrial and on-vehicle HVICs of a 800 V class rating voltage, it is still difficult, only by optimizing a thickness of the embedded dielectric layer (the dielectric layer 901) and a thickness and an impurity concentration of the n− type semiconductor layer 902, to attain an aimed withstand voltage, to say nothing of developing market products.

In constructing a power conversion integrated circuit such as an HVIC, high voltage wiring connection is done with an aluminum wiring or a bonding wire from a drain electrode of a high withstand voltage NMOSFET functioning as a level shifter element to a floating reference gate drive circuit region (an HV island) having a dielectrically isolated high side driving circuit. The high voltage wiring connection is carried out form a dielectrically isolated high withstand voltage NMOSFET to an adjacent or a separated floating reference gate drive circuit region stably without creating a local withstand voltage-limiting region. Japanese Unexamined Patent Application Publication No. 2006-313828 (hereinafter "Patent Document 1") and Japanese Patent No. 4020195 (hereinafter "Patent Document 2") disclose a method of high voltage wiring connection with a bonding wire. Patent Documents 1 and 2 disclose a technique to maintain a high withstand voltage of a semiconductor device by disposing another dielectric layer adjacent to the original dielectric layer in the lamination direction.

As described above, in order to attain HVICs for industrial and on-vehicle applications of voltage ratings of 600 V and 800 V using an SOI substrate, there are two main problems in obtaining commercial products; to achieve a high withstand voltage in the level shifter element of a high withstand voltage NMOSFET and to accomplish high voltage wiring outputted from the drain electrode of the level sifter.

In order to cope with the two problems, Japanese Unexamined Patent Application Publication No. 2006-148058 (hereinafter "Patent Document 3") discloses a technique using a device comprising a plurality of transistor elements that are level shifter elements dielectrically isolate and connected in series with one another.

FIG. 12 shows a basic equivalent circuit of the semiconductor device disclosed in Patent Document 3. FIG. 13 is a schematic plan view showing arrangement of composing elements indicated in the circuit diagram of FIG. 12. FIG. 14 is a sectional view cut along the line A-A in FIG. 13 and FIG. 15 is a sectional view cut along the line B-B in FIG. 13.

Referring to FIG. 12, n ($\geq 2$) transistor elements Tr1 to Trn dielectrically isolated with and from each other are sequentially connected between the GND potential and the predetermined potential Vs with the side of the GND potential being the first stage and the side of the predetermined potential Vs being the n-th stage. The gate terminal of the first stage transistor Tr1 is an input terminal. n resistance elements R1 to Rn are sequentially connected in series between the GND potential and the predetermined potential Vs with the side of the GND potential being the first stage and the side of the predetermined potential Vs being the n-th stage. The gate terminals of the transistor elements Tr2 to Trn are sequentially connected to the connection points between adjacent stages of series connected resistance elements R1 to Rn. An output is extracted from a terminal at the side of the predetermined potential Vs of the n-th stage transistor Trn, through a load resistor (not shown in the figure) having a predetermined resistance value.

A multiple of field isolation trenches T1 to Tn are formed reaching the embedded dielectric layer 3 as shown in FIGS. 13, 14, and 15. Each of the n transistor elements Tr1 to Trn dielectrically isolated with each other is sequentially disposed in each filed region surrounded by each of the field isolation trenches T1 to Tn surrounding and containing higher stage transistor elements. Wiring that crosses over a dielectric isolation trenches 4 and Tn is formed with a metal wire.

However, in the structure of transistors as shown in FIG. 13 and FIG. 14 in the construction disclosed in Patent Document 3, a metal wire crossing over the trench is used for a high voltage wiring connecting the drain of the Tr n−1 to the source of the Trn, for example. As a consequence, the metal wiring at a high voltage may cause dielectric breakdown of the interlayer dielectric film under the metal wiring. In addition, the metal wiring at a high electric potential level increases a leakage current from the metal wiring of the drain along an inner wall of a dielectric isolation trench to the source region surrounded by the same isolation trench. Therefore, means must be taken to prevent the interlayer dielectric film from dielectric breakdown, to suppress leakage current, and to reduce a voltage born by each transistor element. As a result, a multiple stage series connection of 5 to 6 stages is required for obtaining a withstand voltage of 1,000 V.

In such a multiple stage construction of 5 to 6 stages, at the time of start up of the HVIC, in which a low side transistor of externally arranged power transistors (MOSFETs or IGBTs) turns ON and a Vs voltage in the floating reference gate drive circuit region of the HVIC becomes the GND potential, the ON resistance of the level shifter is ON resistance per one transistor element (1 k$\Omega$, for example) times 5 to 6 (the number of transistors). Provided an ON current being 1 mA, the ON voltage of the level shifter amounts to 1 k$\Omega \times$1 mA$\times$(5-6)=5-6 V, which is a problematically large value. A high ON voltage of the level shifter requires raising a lower limit voltage of a low input under voltage lock out circuit (UVLO circuit) contained in a high side driving circuit. The UVLO circuit halts a circuit operation of the floating reference gate drive circuit region when an electric potential at a high potential side terminal of the floating reference gate drive circuit region power supply decreases to a value lower than a predetermined potential. As a consequence, a problem arises that an operation voltage range of the floating reference gate drive circuit region circuit is narrowed since low voltage operation is restricted corresponding to the elevated lower limit voltage of the ULVO circuit.

Due to the multiple stage series connection construction of the MOSFETs, each of the multiple stage connected MOSFETs has, in observation from the first stage MOSFET, cumulated amount of n parallel connected stages of gate-source capacitance component Cgs, a gate-drain capacitance component Cgd, and further, a source-drain junction capacitance Cds. Consequently, the RC time constant increases and degrades the response performance in high speed switching operation.

SUMMARY OF THE INVENTION

In view of the above problems, it is an object of embodiments of the present invention to provide a high-voltage semiconductor device in which an elevated withstand voltage is achieved at a low cost for a level shifter element of a high withstand voltage NMOSFET formed on an SOI substrate without any complicated manufacturing process such as addition of back surface steps. Another object of embodiments of the invention is to provide a high-voltage semiconductor device that achieves low voltage driving and quick response, owing to stable high voltage wiring and a low ON voltage.

To solve the above problems and accomplish the objects, in some embodiments, a high-voltage semiconductor device can comprise a first conductivity type semiconductor region and n transistors formed in the first conductivity type semiconductor region, in series connection with one another, n being two or more, wherein a source electrode of a first stage transistor of the n transistors is connected to a low potential side of the semiconductor device and a drain electrode of a n-th stage transistor is connected to a high potential side of the semiconductor device; the transistors nearer to the high potential side are surrounded by the transistors nearer to the low potential side; and a gate terminal of the first stage transistor is a signal input terminal, and a drain terminal of the n-th transistor is a signal output terminal.

Each transistor of the n transistors can comprise a source layer formed in a surface region of the semiconductor region in a ring shape, a drain layer formed in the surface region of the semiconductor region inside the source layer with a predetermined distance from the source layer, a source electrode in connection with the source layer, a drain electrode in connection with the drain layer, and a connection wiring that connects the drain electrode of a preceding stage transistor to the source electrode of a following stage transistor, and n resistance elements formed in series connection with one another between the drain electrode of the n-th stage transistor and the low potential side, a low potential side of each resistance element being connected to the gate electrode of each stage of transistor.

The high-voltage semiconductor device can be configured such that a planar shape of a periphery of each transistor of the n transistors is a circle or an ellipse.

The high-voltage semiconductor device can be configured such that the semiconductor region is formed on a support substrate interposing an embedded dielectric layer and partitioned by dielectric isolation from adjacent regions with trenches having a planar shape of a ring and containing buried dielectric substance; and the dielectric layer is the embedded dielectric layer.

The high-voltage semiconductor device can be configured such that each stage of n transistors comprises: a well diffusion layer of a second conductivity type formed in a ring shape in the semiconductor region, a source layer of the first conductivity type selectively formed in a ring shape in a surface region of the well diffusion region, a drain layer of the first conductivity type formed in the surface region of the semiconductor region inside the source layer with a predetermined distance from the source layer, a gate electrode formed over a surface of the well diffusion layer between the semiconductor region and the source layer interposing a dielectric insulation film, a source electrode in connection with the source layer and the well diffusion layer, and a drain electrode in connection with the drain layer; and the high-voltage semiconductor device further comprises a connection wiring that connects the drain electrode of each of the first stage to (n−1)-th stage transistors to the source electrode of an adjacent inside transistor.

The high-voltage semiconductor device can include a threshold voltage of the first stage transistor is higher than that of any other stages of transistor.

The high-voltage semiconductor device can comprise a drain pad in connection with the drain electrode of the n-th stage transistor.

The high-voltage semiconductor can comprise resistance elements formed in series connection with one another between the drain layer of the n-th stage transistor and the low potential side, a low potential side of the each stage of resistance element being in connection with the gate electrode of the stage of transistor.

The high-voltage semiconductor device can be configured such that the well diffusion layer of at least one of the n transistors reaches the embedded dielectric layer.

The high-voltage semiconductor device can comprise a floating reference gate drive circuit region surrounded by a trench reaching the embedded base region different from the tranches, in another region of the semiconductor region of the semiconductor layer, and an electrode pad formed on the floating reference gate drive circuit region, the electrode pad being connected to the drain pad with a bonding wire.

The high-voltage semiconductor device of embodiments of the invention allows a thickness of the embedded dielectric layer required for achieving a predetermined withstand voltage minimized. Thus, a high withstand NMOSFET is attained at a low substrate cost. Since a thick embedded dielectric layer, like in the single stage structure, is not required, the problem of warping of wafer in the manufacturing process is minimized.

Since a plurality of stages of concentric transistors are formed so that the drain of each transistor is surrounded by the source, despite wiring connection between the drain of a low potential side transistor and the source of the adjacent high potential side transistor, no potential difference exists between the drain and the source. Thus, generation of leakage current is suppressed between the source and the drain. As a result, ignoring the leakage current and dielectric breakdown of an oxide film, a voltage born by one transistor can be increased. High voltage born by one transistor leads to reduction of the number of stages of series connected transistors. Consequently, the capacitance component is reduced in the level shift circuit section including the high withstand voltage NMOSFETs and in addition, low ON voltage operation can be performed. Therefore, the turn ON/OFF transfer delay time of the whole high side driving circuit is shortened, to provide a high-voltage semiconductor device performing fast response. The number of stages is reduced from the construction disclosed in Patent Document 3, described above. Therefore, a range of scattering in ON current is reduced for the entire level shifter element with a series connected multiple stage construction, implementing stable switching operation.

DETAILED DESCRIPTION

Figure 1A:
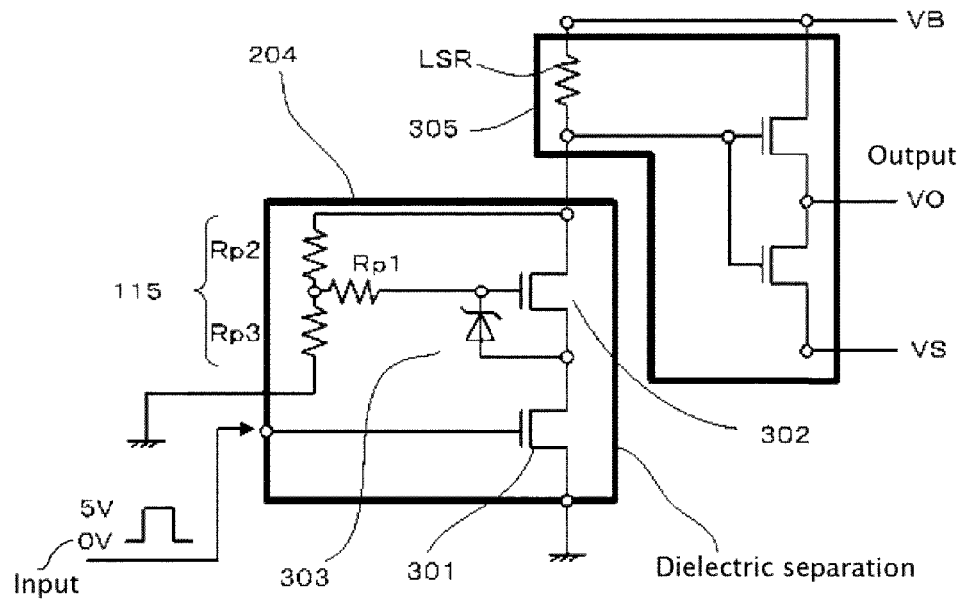
FIGS. 1(a) and 1(b) show an equivalent circuit diagram of an HVIC including a high-voltage semiconductor device according to the present invention.

When a high voltage is applied on a drain terminal of a high-voltage semiconductor device on an SOI substrate, a depletion layer generally extends from a pn junction between a second conductivity type well diffusion layer and a first conductivity type semiconductor region, the latter corresponding to a drift drain region. At the same time, a depletion layer extends from a junction between an embedded dielectric layer and the first conductivity type semiconductor region. In the course of the depletion layer expansion, a high electric field spot emerges at a junction between the embedded dielectric layer right under the drain electrode and the first conductivity type semiconductor region, reaching the critical electric field, and rushes into avalanche breakdown.

Here, description is made on a high-voltage semiconductor device that is composed of series connected multiple stage of high withstand voltage NMOSFETs formed in a concentric configuration. In a specific example of the series connected two stage high-voltage semiconductor device 204 shown in FIGS. 1(a) through 3, when a high voltage is applied on the drain electrode 114 of the second stage transistor 302 connected at the high potential side, since a wire connection is made between the drain electrode 1072 of the first stage transistor 301 connected at a low potential side and the source electrode 1071 of the second stage transistor 302, partial potential bearing takes place so that high electric field places are created at a boundary between the n− type semiconductor layer 101 and the embedded dielectric layer 200 right under the drain electrode 1072 and at a boundary between the n− type semiconductor layer 101 and the embedded dielectric layer 200 right under the drain electrode 114. Avalanche breakdown begins to rush at the boundary between the n− type semiconductor layer 101 and the embedded dielectric layer 200 right under the drain electrode 114 of the second stage transistor 302. At this moment, since the electric potential level of the source n+ layer 109 and the p type well diffusion layer 111 of the second stage transistor 302 is elevated to a high potential level corresponding to the drain potential level of the first stage transistor 301, the electric potential of the n-type semiconductor layer 101 and the embedded dielectric layer 200 under the drain electrode 114 of the second stage transistor 302 is able to bear a higher electric potential than the potential in the case of a single stage construction. The construction of this embodiment can bear about 1.2 to 1.3 time's higher electric potential.

Specifically, provided a thickness of the embedded dielectric layer 200 formed of a silicon oxide film is 5 μm and a thickness of the n− type semiconductor layer 101 is 20 μm in the specification of the SOI substrate, a withstand voltage of the embodiment with a series connected concentric two stage structure is enhanced to about 1,000 V, which is 1.3 times the source-drain withstand voltage of 750 V for one stage. In an ON state, since a Zener diode 303 is formed between the drain electrode 1072 of the first stage transistor 301 and the gate electrode 112 of the second stage transistor 302, upon ON state brought about by an input signal put to the gate electrode 106 of the first stage transistor 301, the second stage transistor 302 turns ON owing to a voltage drop in the Zener diode 303. Thus, the second stage transistor 302 can transfer an output signal from the drain electrode 114. Since, a source-drain withstand voltage of the high-voltage semiconductor device 204 in this ON state is twice as high as the ON withstand voltage of each of the first stage transistor 301 and the second stage transistor 302, the high-voltage semiconductor device 204 working as a level shifter operates in a switching operation with an applied high voltage without any problem. An ON voltage of the overall high-voltage semiconductor device 204 is determined by an ON current and the ON resistance of two stages of the first stage transistor 301 and the second stage transistor 302. In the case of an ON resistance of 1 kΩ per one stage and ON current of 1 mA, a resulting ON voltage of 2 V is sufficient for turning ON the two stages. Thus, the HVIC can operate at a low voltage. This ON voltage can be further reduced by setting a threshold voltage Vth of the second stage transistor 302 to be lower than that of the first stage transistor 301. For a specific example with a threshold voltage Vth of the first stage transistor 301 at 2 V, a threshold voltage Vth of the second stage transistor 302 can be set at about 1V by shortening the channel length than that of the first stage transistor 301, and by reducing a surface impurity concentration under the gate electrode 112 to a value lower than that of the first stage transistor 301, which can be carried out by ion implantation of low dose n type impurities into the p type well diffusion layer 111 or by changing a diffusion depth of the p type well diffusion layer 111. The ON resistance can also be set at a value lower than 1 kΩ by these means. In this condition, an ON voltage of the overall level shifter with series connected two stages can be lower than 2 V. Thus, a lower ON voltage of an overall level shifter element and lower power supply voltage driving are accomplished as compared with a conventional multiple stage series connected construction.

The dielectric isolation structure with the trench 123 containing the dielectric substance 124 is formed surrounding the outer periphery of the source electrode 105 of the first stage transistor 301 that is connected to the GND potential, performing dielectric isolation from the surroundings. The p type well diffusion layer 111 performs dielectric isolation between the first stage transistor 301 and the second stage transistor 302. In place of the p type well diffusion layer 111, an isolation structure is possible in which a p type well diffusion layer with the same depth as the p type well diffusion layer 102 is formed and the periphery thereof is surrounded by the dielectric isolation structure composed of the trench 123 containing the dielectric substance 124. In the embodiment, electrical connection from the drain electrode 114 of the second stage transistor 302 to the floating reference gate drive circuit region 305 is not carried out by metal wiring that runs creeping on the dielectric material put on the isolation region 555 with the trenches 123, but implemented by a bonding wire 116 from the drain pad 119 in electrical connection with the drain electrode 114 of the second stage transistor 302 to the floating reference gate drive circuit region 305 isolated with the multiple dielectrics of the trenches 123. Therefore, stable high potential wiring is accomplished without degradation of withstand voltage due to electric field concentration on the isolation region 555 with the trenches 123 or source-drain leakage along the internal wall of the trenches 123. Moreover, the high potential wiring of the bonding wire 116 allows disregard for degradation of withstand voltage at the isolation region 555 with the trenches 123 and for breakdown of the field oxide film 125 and the interlayer dielectric film ILD 126. Consequently, a divided voltage level per one element is increased and a withstand voltage level of 600 V to 1,000 V can be implemented solely by a series connected two stage construction as in the embodiment.

Therefore, a high-voltage semiconductor device of the invention minimizes a thickness of the embedded dielectric layer required for attaining a predetermined withstand voltage and provides an enhanced withstand voltage of a high withstand voltage NMOSFET at a low substrate cost. The embedded dielectric layer does not need to be thick, which eliminates the problem of warping in the manufacturing process. A capacitance component accompanying a level shift circuit of a high withstand voltage NMOSFEZT is reduced and low ON voltage operation is achieved. Consequently, a high-voltage semiconductor device performing quick response has been provided.

First Embodiment

Figure 1B:
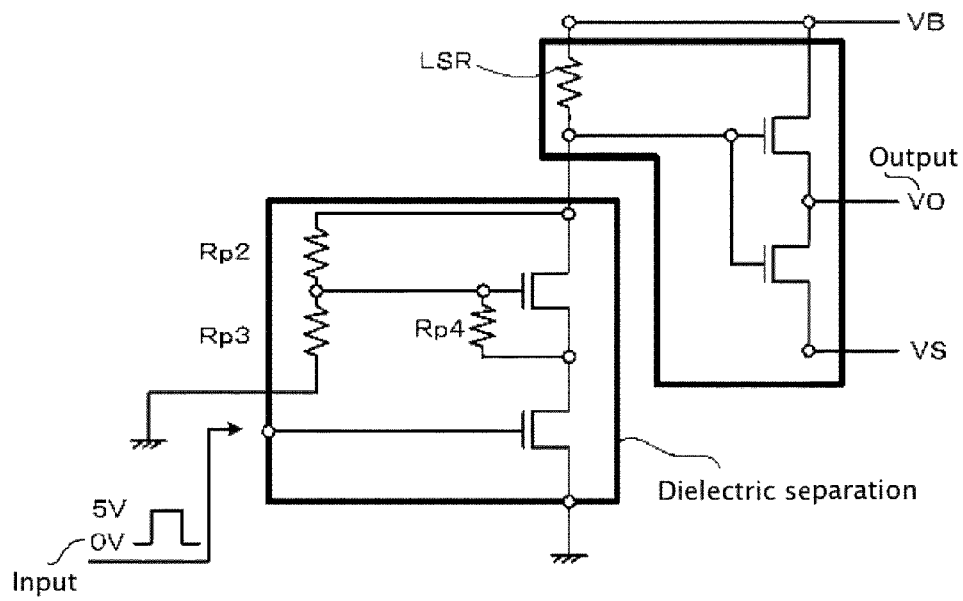
Figure 2:
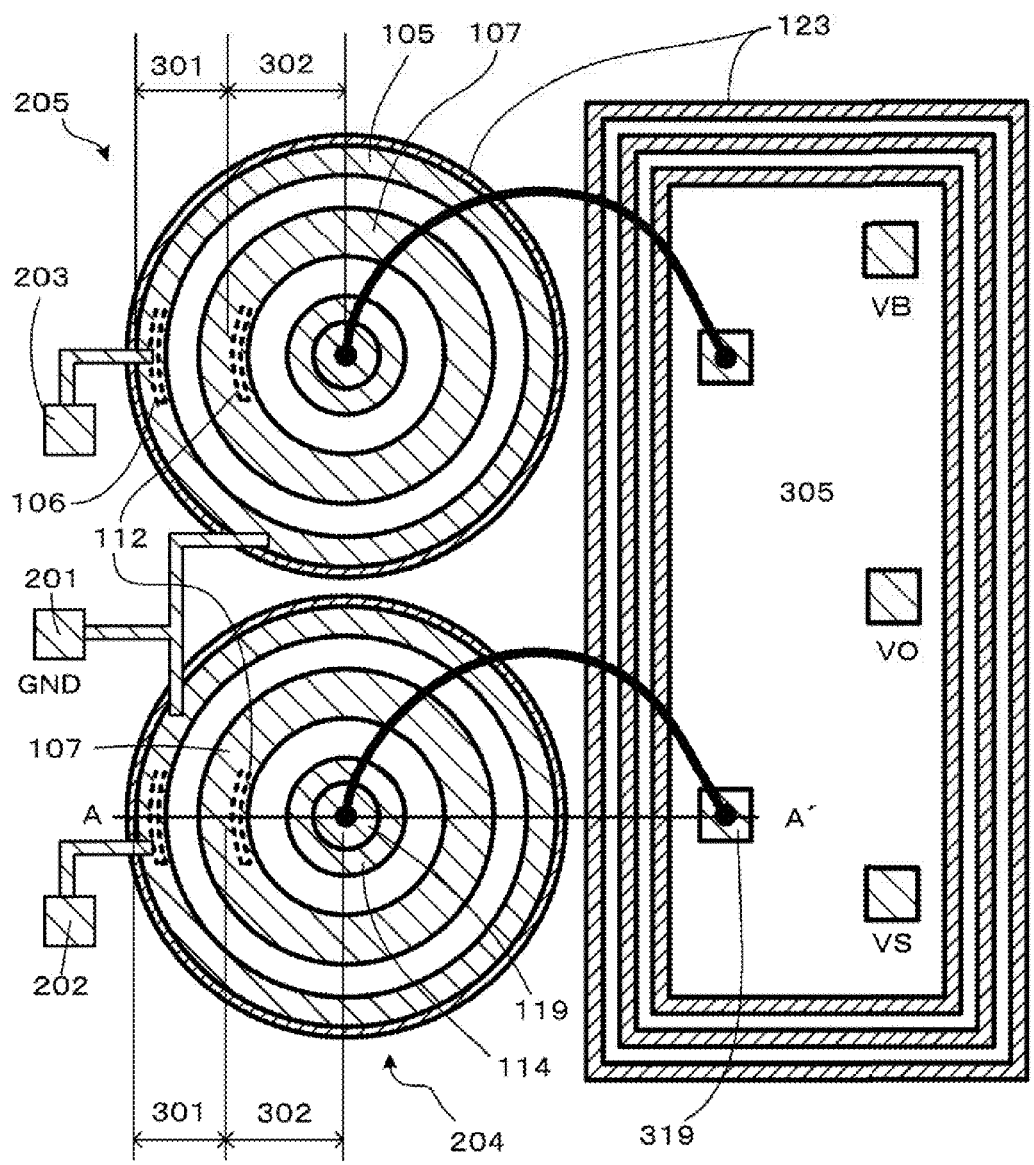
FIG. 2 is a schematic plan view of a high-voltage semiconductor device of the invention and a floating reference gate drive circuit region.

FIGS. 1(a) and 1(b) show an equivalent circuit diagram of an HVIC including a high-voltage semiconductor device according to the present invention. The constructions of FIGS. 1(a) and 1(b) are different in that a Zener diode 303 is used between a gate and a source of the second stage transistor 302 in the construction of FIG. 1(a) whereas a resistance element Rp4 is employed at that place in the construction of FIG. 1(b). FIG. 2 is a schematic plan view of the high-voltage semiconductor device 204 shown in FIGS. 1(a) and 1(b), another high-voltage semiconductor device 205 (not shown in FIGS. 1(a) and 1(b)), and a floating reference gate drive circuit region 305.

FIGS. 1(a) and 1(b) show block circuit diagrams in simplified representation for a level sifter input to the HVIC, a level shift resistance LSR, and a high side driving circuit in the floating reference gate drive circuit region 305. A set signal is inputted to the first stage transistor 301 of the high-voltage semiconductor device 204, which is a level shifter, and a reset signal is inputted to another level sifter of one of a pair of level shifters (another level shifter is not shown in FIGS. 1(a) and 1(b) but shown in FIG. 2 as a high-voltage semiconductor device 205). An output signal is outputted from the output VO for driving a gate of an external power MOSFET or an IGBT (these power devices are not shown in FIGS. 1(a), 1(b), and 2). Basically, the part between VB and VS of the circuit in FIGS. 1(a) and 1(b) is charged up to a power supply voltage by a bootstrap capacitor. At a moment of turn OFF of the gate of the external low side power MOSFET or IGBT, a set signal is inputted to a high side driving circuit from a control circuit. In an HVIC used in high voltage power supplies for industrial field, after the input of set signal, the potential VS, which is a lowest level of the floating reference voltage, transiently surges up to 800 V due to external inductor component, and then settles down to a voltage from 400 to 500 V. Meanwhile, the high-voltage semiconductor device 204 instantaneously gives an ON current in an ON state at 800 V to supply with the current to the level shift resistor (LSR) side. Owing to a voltage drop in the level shift resistor (LSR) between the drain of the high-voltage semiconductor device 204 and the VB terminal (at the highest of the floating reference potential), the gate of the MOSFET composing a high side driving circuit in the floating reference gate drive circuit region 305 can be driven.

As a result, a set signal is transferred from the VO terminal to turn ON a gate of an external power MOFET or IGBT. A reset signal opposite to the set signal is outputted from the VO terminal. A basic operation of the high side driving circuit of an HVIC is to transfer the set and reset signals to the gate of the external power MOSFET or IGBT driving the power MOSFET or IGBT used in a high voltage power supply of a DC 500 V power supply. Consequently, the drain side of the high-voltage semiconductor devices 204 and 205 is subjected to a surge voltage of a high value of about 800 V in either state of ON and OFF, requiring a source-drain withstand voltage of about 1,000 V.

In order to attain a withstand voltage of 1,000 V, two stages of series connected level shifters are formed in a concentric configuration, as shown in FIG. 2. FIG. 2 shows both level shifters of the high-voltage semiconductor device 204 for setting operation and the high-voltage semiconductor device 205 for resetting operation. The following description will be made using the same symbols for the region of the high-voltage semiconductor device 204 and for the region of the high-voltage semiconductor device 205. Description will be made also on the floating reference gate drive circuit region 305 depicted in FIGS. 1(a) and 1(b). Description on some circuit components including the level shift resistor in the floating reference gate drive circuit region 305 is omitted. The floating reference gate drive circuit region 305 in FIG. 2 is mainly illustrated with wiring layers and tranches 123.

In the high-voltage semiconductor devices 204 and 205, an input pad 202 for inputting a set signal and an input pad 203 for inputting a reset signal are connected to the gates of the first stage transistors 301. A low potential side pad 201 is connected to the sources of the first stage transistors 301. Each of the source electrodes 105 is disposed at the outermost periphery and inside the trench 123. Inside the source electrode 105, an electrode 107 is disposed, to which the drain electrode 1072 of the first stage transistor 301 and the source electrode 1071 of the second stage transistor 302 are wire connected. Inside the electrode 107, the drain electrode 114 and the drain pad 119 that is connected to the drain electrode 114 are disposed. The gate electrode 106 of the first stage transistor 301 and the gate electrode 112 of the second stage transistor 302 are formed in a configuration of a short arc. The drain pad 119 is connected to the electrode pad 319 on the floating reference gate drive circuit region 305 by a bonding wire 116. Although not shown in FIGS. 2 and 3, the electrode pad 319 is connected to the level shift resistor and the high side driving circuit. The pad VB, the pad VO, and the pad VS connect to a lead frame for external output through a bonding wire, for example.

Figure 3:
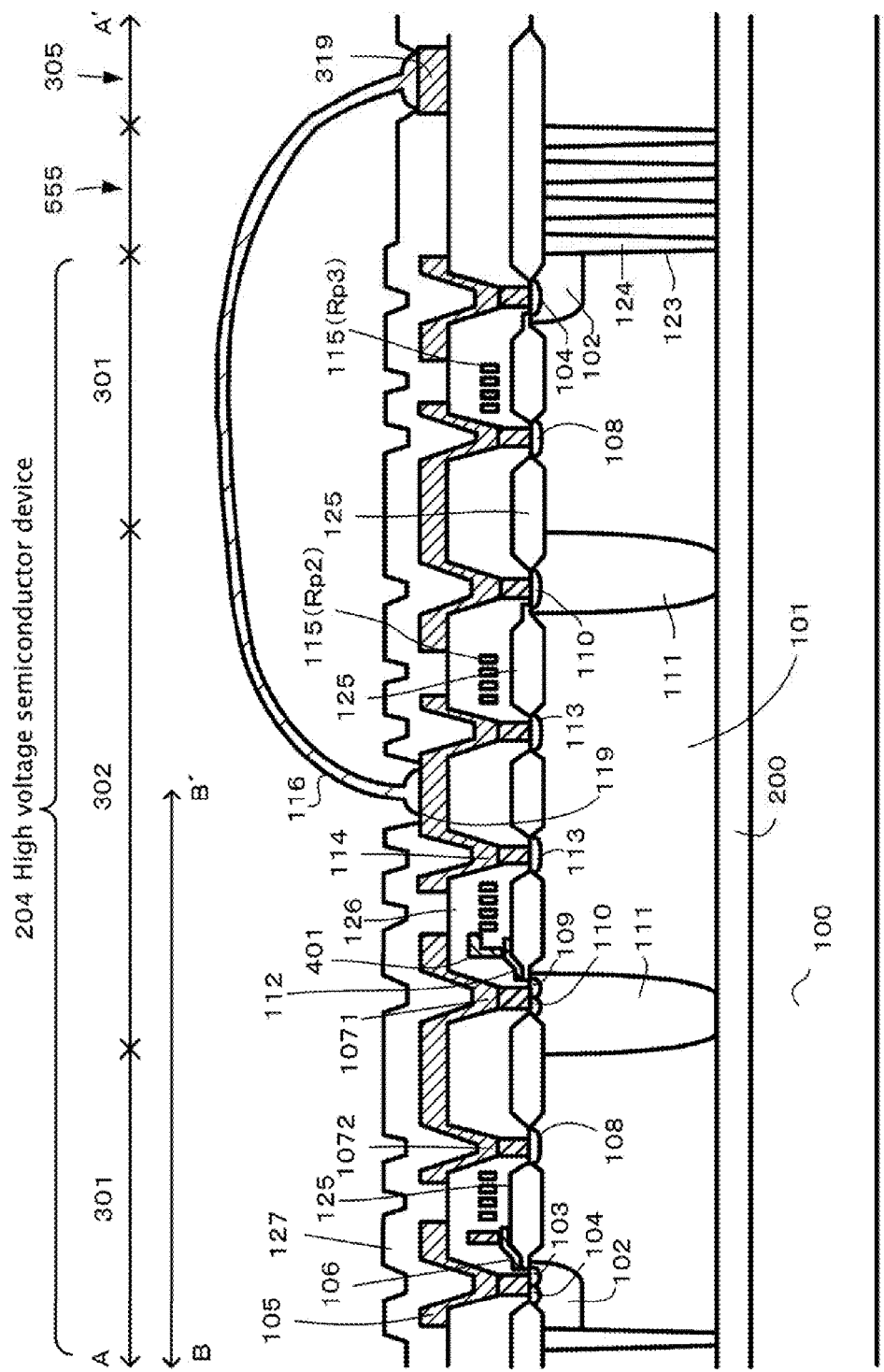
FIG. 3 is a sectional view cut along the line A-A' in FIG. 2.
Figure 4:
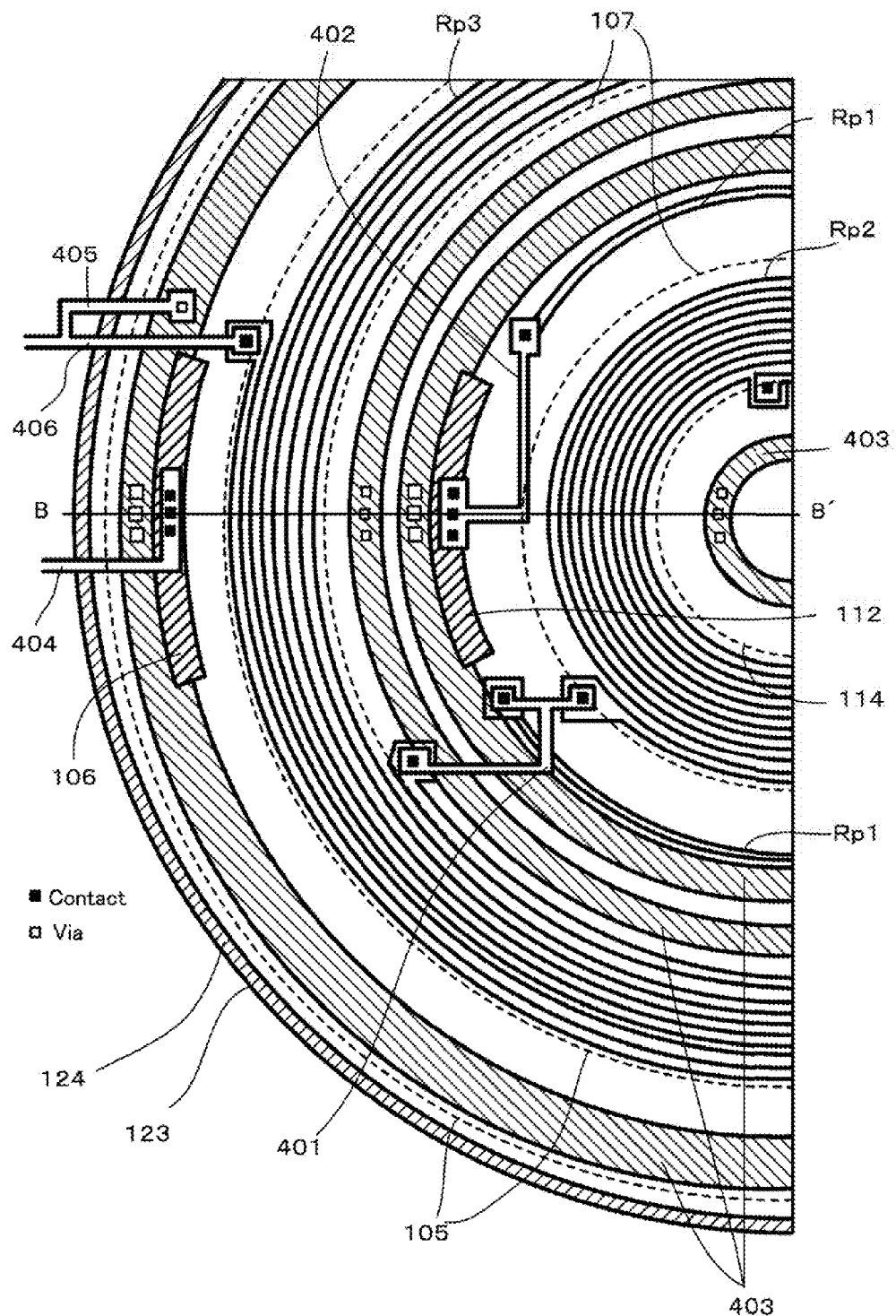
FIG. 4 is an enlarged schematic plan view of a part of a high-voltage semiconductor device of the invention.
Figure 5:
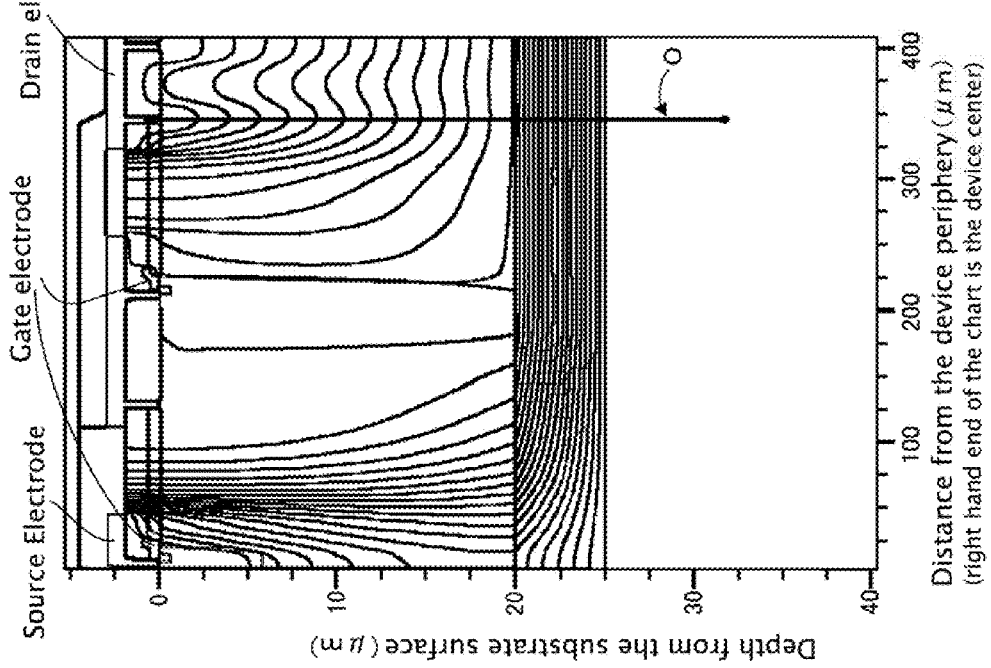
FIGS. 5(a) and 5(b) show a result of device simulation on a high-voltage semiconductor device of the invention.
Figure 5:
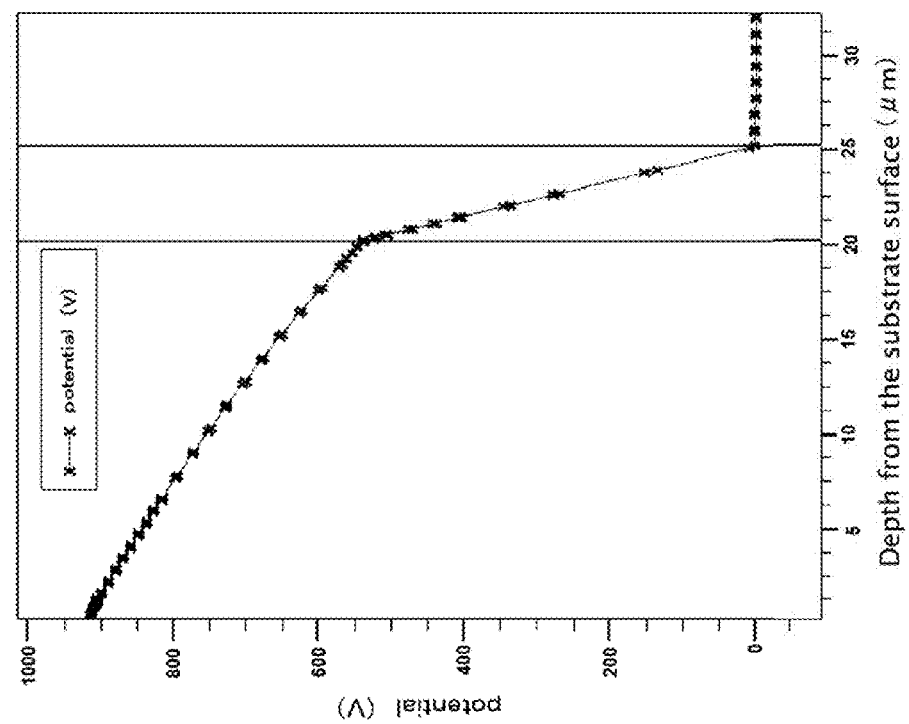
Figure 6:
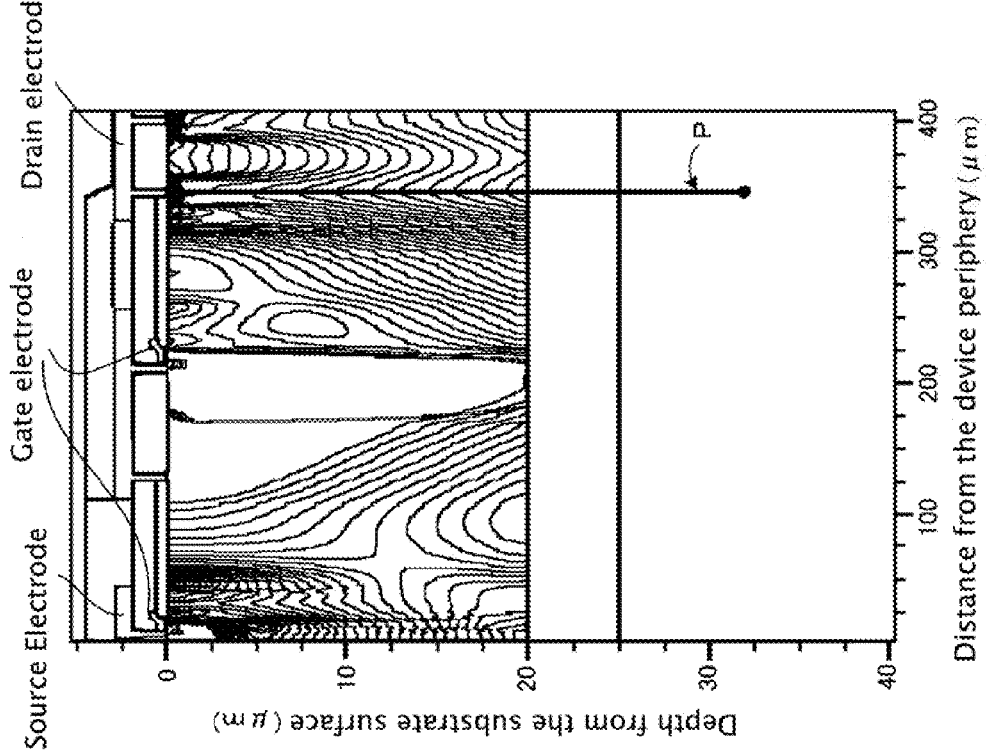
FIGS. 6(a) and 6(b) show a result of device simulation on a high-voltage semiconductor device of the invention.
Figure 6:
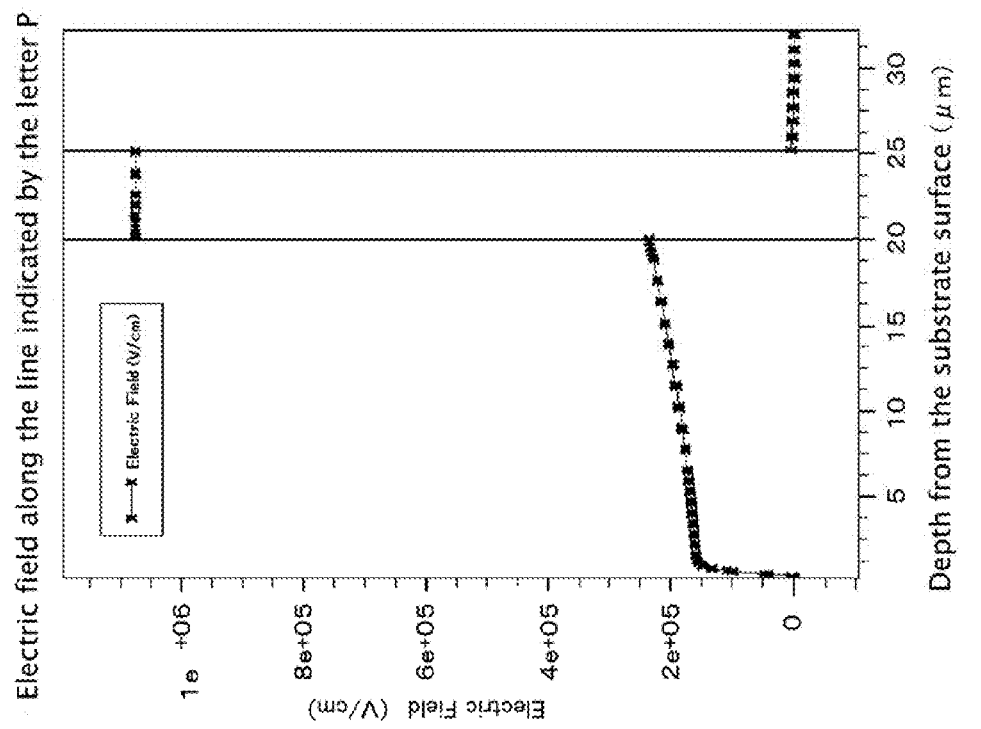
Figure 7:
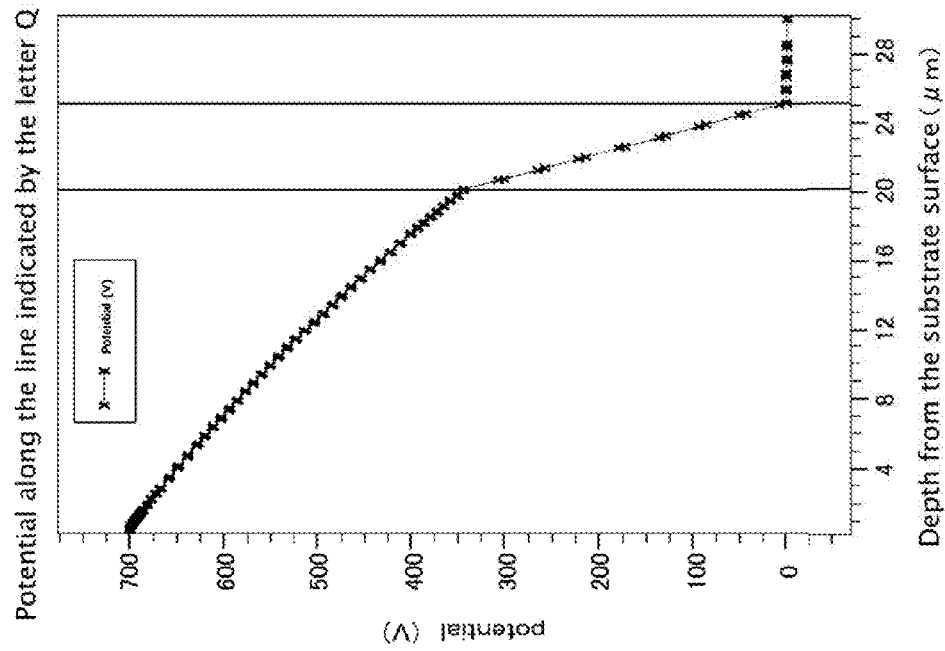
FIGS. 7(a) and 7(b) show a result of device simulation on a comparative example with a single stage construction.
Figure 7:
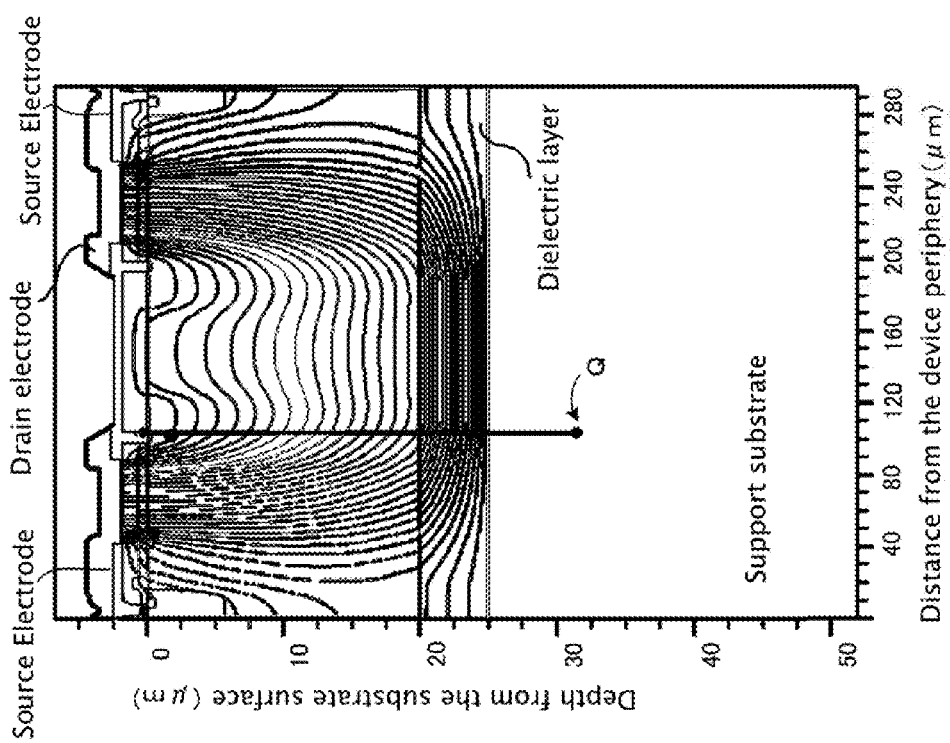
Figure 8:
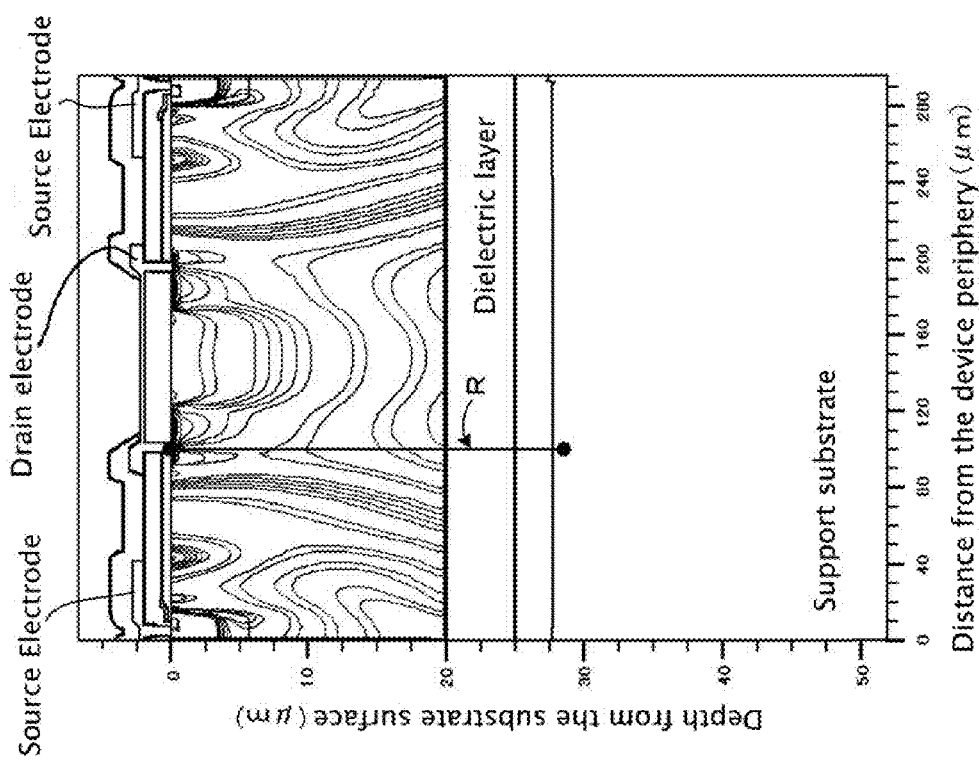
FIGS. 8(a) and 8(b) show a result of device simulation on a comparative example with a single stage construction.
Figure 8:
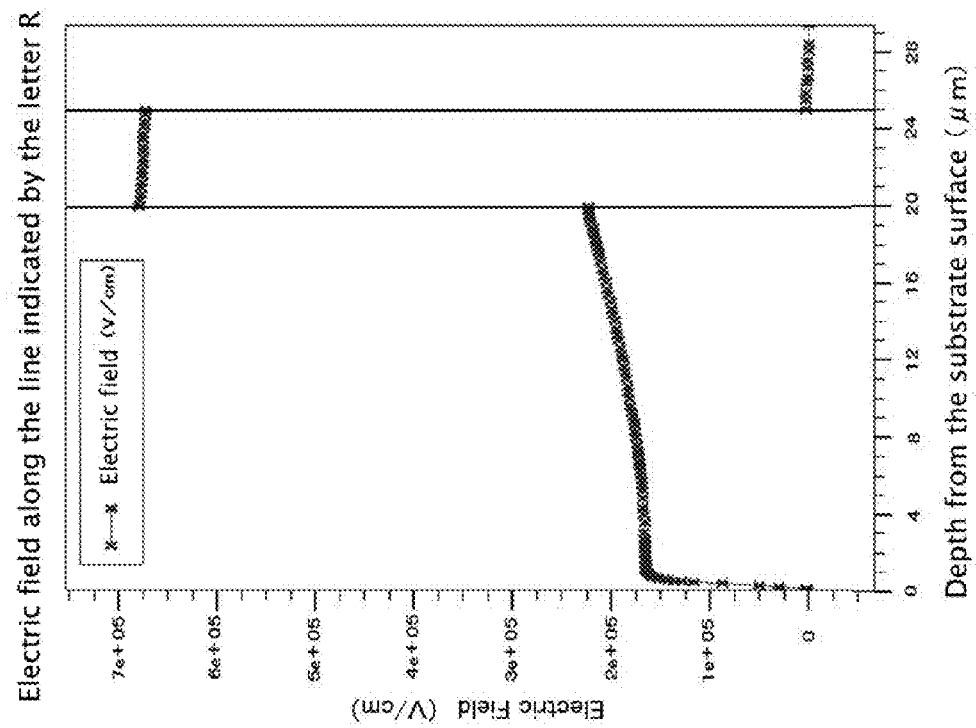

FIG. 3 is a sectional view cut along the line A-A' in FIG. 2 showing a device structure of the high-voltage semiconductor device 204. The other high-voltage semiconductor device 205 has the same structure as that of the high-voltage semiconductor device 204. FIG. 3 shows cross sections of the first stage transistor 301 and the second stage transistor 302. FIG. 4 is an enlarged schematic plan view of a part of the high-voltage semiconductor device 204. The cross section cut along the line B-B' in FIG. 4 corresponds to a part of the sectional view of FIG. 3.

Referring to FIG. 3, the high-voltage semiconductor device 204 comprises a support substrate 100, an embedded dielectric layer 200 provided on the upper surface of the support substrate 100, and an n− type semiconductor layer 101 provided on the upper surface of the embedded dielectric layer 200. The embedded dielectric layer 200 dielectrically isolates the n− type semiconductor layer 101 from the support substrate 100. The n-type semiconductor layer 101 is dielectrically isolated and partitioned in the horizontal direction by trenches 123 and dielectric substance 124 buried in the trenches 123 that reaches the embedded dielectric layer 200. A silicon oxide film is used for the dielectric substance 124 in this embodiment. A drain drift region of the second stage transistor 302 is the n− type semiconductor layer 101 in a predetermined range within the partition of the n− type semiconductor region partitioned by the trenches 123 containing the buried dielectric substance 124. The second stage transistor 302 comprises, in the drain drift region thereof, a p type well diffusion layer 111 that reaches the embedded dielectric layer 200 and isolates the other stage transistor, a source n+ layer 109 and a well pick up p+ layer 110, the two layers being formed in the p type well diffusion layer 111, and a high concentration drain n+ layer 113 formed with a predetermined distance from the source n+ layer 109. The drain n+ layer 113, though formed in a loop shape in this embodiment, can be in a ring shape (i.e., a circular shape) or in an elliptic-shape. In the case of the drain n+ layer 113 formed in a elliptic shape, other regions surrounding the drain n+ layer 113 are also formed in an elliptic shape, and a planar shape of the high-voltage semiconductor device 204 also becomes an elliptic shape. A gate electrode 112 is provided over the source n+ layer 109, the p type well diffusion layer 111, and the drift drain region, interposing a dielectric film. A source electrode 1071 is provided on the source n+ layer 109 and the well pick up p+ layer 110, and a drain electrode 114 is provided on the drain n+ layer 113. The source electrode 1071 and the drain electrode 114 are insulated with one another by a field oxide film (LOCOS) 125, an interlayer dielectric film 126, and a passivation film 127 composed of a plasma silicon nitride film. The source electrode 1071 and the drain electrode 114 both extend towards the other over the drift drain region to compose a field plate electrode.

A drain drift region of the first stage transistor 301 is also the n− type semiconductor layer 101. A drain n+ layer 108 of the first stage transistor 301 is provided in a ring shape surrounding the whole first stage transistor 301 outside the p type well diffusion layer 111. A p type well diffusion layer 102 is formed distant from the drain n+ layer 108 and in a ring shape surrounding the drain n+ layer 108. A source n+ layer 103 and a well pick up p+ layer 104 are formed in a region of the p type well diffusion layer 102. A gate electrode 106 is provided over the source n+ layer 103, the p type well diffusion layer 102, and the drift drain region, interposing a dielectric film. A source electrode 105 and a drain electrode 1072 are provided on the source n+ layer 103 and the drain n+ layer 108, respectively. The source electrode 105 and the drain electrode 1072 are insulated with and from one another with a field oxide film (LOCOS) 125, an interlayer dielectric film 126, and a passivation film 127. The drain electrode 1072 of the first stage transistor 301 and the source electrode 1071 of the second stage transistor 301 are connected to one another with a wiring. The source electrode 105 and the drain electrode 1072 extend towards the other electrode over the drift drain region to construct a field plate electrode.

A thickness of the embedded dielectric layer 200 in the case of silicon oxide film, for example, is Tox=3.0-5.0 μm, and a thickness of the n− type semiconductor layer 101 is, for example, Tsoi=10-20 μm. A width of the trench 123 for dielectric isolation is Lt=1.0-2.0 μm, for example. The trench 123 is etched by dry etching process carried out using a trench etcher apparatus and filled with the dielectric substance 124 of a TEOS (tetraethoxysilane) oxide film by a filling process using a plasma CVD apparatus. The dielectric substance 124 is filled to reach the embedded dielectric layer 200, and the contact part of the bottom surface of the trench 123 is formed to have a width Lt of at least 1.0 μm. The p well diffusion layer 102 is formed in a process of high temperature thermal oxidation and nitrogen driving, with a diffusion depth of Xj=3.0-4.0 μm. A high resistivity n type substrate having a resistivity of 10-20 Ωcm is used for the n− type semiconductor layer 101. A surface impurity concentration of boron in the p type well diffusion layer 102 is 1.0-5.0 E17/cm$^3$. The p type well diffusion layer 111 is formed with a depth reaching the embedded dielectric layer 200 in a process of high temperature thermal oxidation and nitrogen driving. A source impurity concentration of boron in the p type well diffusion layer 111 is in the range of 1.0- to 9.0 E16/cm$^3$. Arsenic impurity concentrations in the source n+ layers 103 and 109, and in the drain n+ layers 108 and 113 are about 1.0E20/cm$^3$. BF$_2$ impurity concentrations in the well pick up p+ layers 104 and 110 are about 1.0E20/cm$^3$. Width of the drain drift regions, the width being a distance between the well diffusion layer 102 and the drain n+ layer 108, and a distance between the p type well diffusion layer 111 and the drain n+ layer 113, is about 80 μm in both the first stage transistor 301 and the second stage transistor 302.

A buffer n layer can be formed surrounding the drain n+ layer 108 with an impurity concentration lower than that in the drain n+ layer 108, and another buffer n layer can be formed surrounding the drain n+ layer 113 with an impurity concentration lower than that in the drain n+ layer 113.

The source electrodes 105 and 1071, and the drain electrodes 1072 and 114 are each composed of two metal wiring layers. The second (upper) wiring layers compose a field plate. The source electrode 1071 of the second stage transistor 302 is in connection with the drain electrode 1072 of the first stage transistor 301 with the second wiring layer. The drain pad 119 is formed by extending the second wiring layer of the drain electrode 114.

The gate electrodes 106 and 112 are arranged in a short arc shape as shown in FIG. 4 for the purpose of reducing a gate-source capacitance and a gate-drain capacitance. The source n+ layers 103 and 109 are also formed in a short arc shape like the gate electrodes 106 and 112. Lengths of the gate electrodes 106 and 112 and the source n+ layers 103 and 109 are preferably set so that the current densities in the first stage transistor 301 and the second stage transistor 302 are equal. Such a setting suppresses local current concentration in the whole high-voltage semiconductor device 204. All the source n+ layers 103 and 109 and the gate electrodes 106 and 112 can be formed in a ring shape.

High electric potential wiring connection from the high-voltage semiconductor device 204 to the floating reference gate drive circuit region (an HV island) 305 over the isolation region 555 is carried out by connecting the drain pad 119 formed connected to the drain electrode 114 to the electrode pad 319 using a bonding wire 116.

FIG. 4 mainly shows voltage dividing resistance elements 115 between VB and GND, a gate resistor Rp1, and connection wirings 401 and 402 for the resistors. The electrodes 107, to which the source electrode 105, the drain electrode 114, the source electrode 1071, and the drain electrode 1072 are connected, are depicted by the dotted line. The parts 403 indicate some of active regions including the drain n+ layers 108 and 113, the source n+ layers 103 and 109, and the well pick up p+ layers 104 and 110.

The voltage dividing resistance elements 115 have a configuration of spirally arranged polysilicon on the n− type semiconductor layer 101 for the first stage transistor 301 and for the second stage transistor 302 interposing the field oxide film 125. The gate resistor Rp1 of the second stage transistor 302 is formed of polysilicon and disposed on the field oxide film 125 of the second stage transistor 302. The resistor Rp1 does not necessarily have a resistance as high as the resistance elements Rp2 and Rp3. Connection between the resistance element Rp2 and the resistance element Rp3 is conducted by a connection wiring 401 that is a first layer (a lower layer) metal wiring of the two metal wirings described previously. Connection between the gate resistor Rp1 and the gate electrode 112 is conducted by a connection wiring 402 that is also a first layer metal wiring. The first layer metal wirings are also used for forming the connection wiring 404 for connecting to the gate electrode 106 and inputting a signal to the gate electrode 106, the connection wiring 405 for connecting to the source electrode 105 and connecting to the GND potential, and the connection wiring 406 for connecting to the resistance element Rp3 and connecting to the GND potential. Though not shown in FIGS. 2, 3, and 4, the Zener diode 303 for clamping the gate potential of the second stage transistor 302 and preventing the gate oxide film from breakdown is also composed using polysilicon. In order to attain a low Zener voltage, p type and n type impurities are ion implanted into the polysilicon though a photo mask, and the Zener diode is inserted between the source and the gate of the second stage transistor 302. High reliability is achieved by clamping at a predetermined voltage so as to obtain an electric field between gate and source of at most 3 MV/cm. Although the construction of FIG. 1(a) is basically superior for stable operation, the circuit construction of FIG. 1(b) can also be used in which a resistance element Rp4 is provided between the gate and the source of the second stage transistor 302 in place of the Zener diode 303. The resistance element Rp4 can be formed of polysilicon as well.

The construction of the high-voltage semiconductor devices 204 and 205 enhances a breakdown voltage of a high-voltage semiconductor device (a lateral NMOSFET) to 1.2 to 1.3 times that of conventional one, the breakdown voltage being determined by a thickness of the embedded dielectric layer 200 and a thickness of the n– type semiconductor layer 101. The high potential side second stage transistor 302 is disposed surrounded by the low potential side first stage transistor 301. The source of the first stage transistor 301 is connected to the GND potential of the low potential side and the drain of the second stage transistor 302 is connected to the high voltage side VB of the floating base region. Although the low potential side is connected to the GND potential in this embodiment, the low potential side is not necessarily connected to the GND potential but a construction is possible in which a resistance element is provided between the low potential side and the GND potential. In this case, the resistance element can be formed using polysilicon for a wiring that connects the low potential side pad 201 to the gate and source of the first stage transistor 301. The gate of the second stage transistor 302 receives an electric potential divided by the dividing resistance element 115 disposed between VB and GND. The VS potential is elevated and at the same time, the second stage transistor 302 is turned ON. Preferably, every resistance element disposed in series connection in the dividing resistance element 115 between the VB and GND has an approximately equal resistance value that is several to several tens of mega ohms in order to reduce power consumption. Since the threshold voltage Vth of the second stage transistor 302 is set at a lower value than the threshold voltage Vth of the first stage transistor 301, a voltage drop can be made low in the second stage transistor 302 when an electric current flows in the high-voltage semiconductor devices 204 and 205. Consequently, an output signal can be outputted at a low potential approximately equal to the drain potential at which the first transistor 301 turns ON.

In the high-voltage semiconductor devices 204 and 205 having a construction with series connected two stages formed in concentric circles, the drain electrode 1072 of the low potential side first stage transistor 301 and the source electrode 1071 of the high potential side second stage transistor 302 are in wire connection with one another. When a high voltage is applied to the drain electrode 114 of the high potential side second stage transistor 302, each of the first and second stage semiconductors 301 and 302 raises its electric potential while bearing each voltage so that high electric field places emerge at a boundary between the n– type semiconductor layer 101 right under the drain n+ layer 108 and the embedded dielectric layer 200 and at a boundary between the n– type semiconductor layer 101 right under the drain electrode 108 and the embedded dielectric layer 200. Avalanche breakdown begins to rush in at the moment when an electric field reaches 3E5 V/cm or higher at the boundary between the n– type semiconductor layer 101 right under the drain n+ layer 113 of the second stage transistor 302 and the embedded dielectric layer 200. At this time, the electric potential at the source n+ layer 109 and the p type well diffusion layer (channel region) 111 of the second stage transistor 302 is elevated to a high potential level corresponding to the drain potential of the first stage transistor 301. Consequently, the electric potentials at the n– type semiconductor layer 101 under the drain n+ layer 113 of the second stage transistor 302 and the embedded dielectric layer 200 can be born up to a higher potential level than in the case of a single stage construction. This construction of the embodiment can elevate the potential to 1.2 to 1.3 times level of the single stage construction. FIGS. 5(a) through 8(b) are potential distribution charts and electric field distribution charts drawn by means of device simulation illustrating an electric field concentration region and equipotential line distribution upon high voltage application in the series connected two stage construction, in comparison with the case of a single stage construction.

FIGS. 5(a) and 5(b), and FIGS. 6(a) and 6(b), show device simulation results on the high-voltage semiconductor devices 204 and 205 according to embodiments of the present invention. FIGS. 7(a) and 7(b), and FIGS. 8(a) and 8(b), show device simulation results on a comparative example with a single stage construction.

Figure 9:
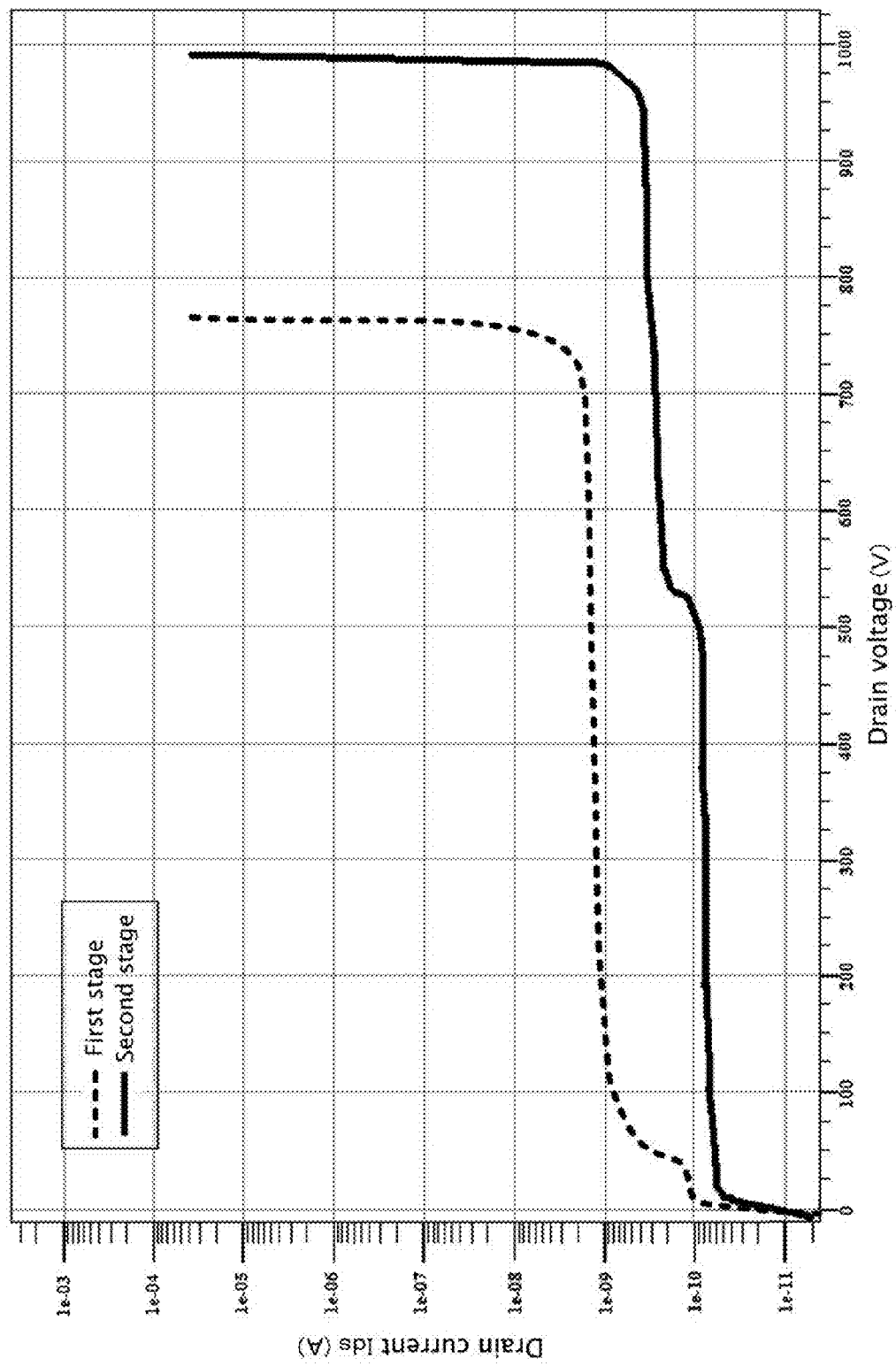
FIG. 9 shows OFF breakdown waveforms for a high-voltage semiconductor device of the invention and for a comparative example with a single stage construction.

The device simulation was carried out for the case of an embedded dielectric layer 200 of a silicon oxide film having a thickness of 5 μm and an n– type semiconductor layer 101 having a thickness of 20 μm. FIG. 9 shows OFF withstand voltage waveforms (breakdown waveforms) for the single stage construction and the series connected two stage construction. As is apparent from FIG. 9, a withstand voltage of a high withstand voltage NMOSFET in which the source-drain withstand voltage is about 750 V in the case of a single stage construction has been elevated to about 1,000 V in the series connected two stage construction.

Second Embodiment

Figure 10:
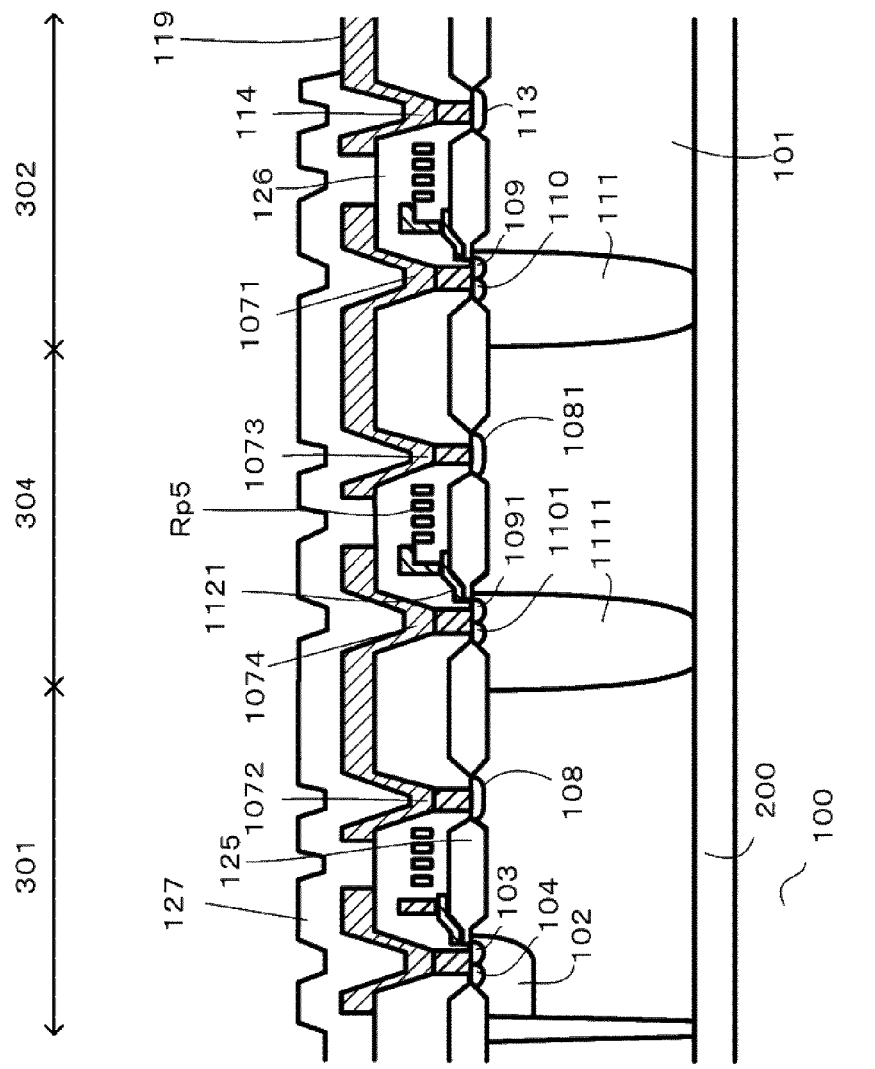
FIG. 10 is a sectional view of an essential part of another embodiment example of a high-voltage semiconductor device of the invention.
Figure 11A:
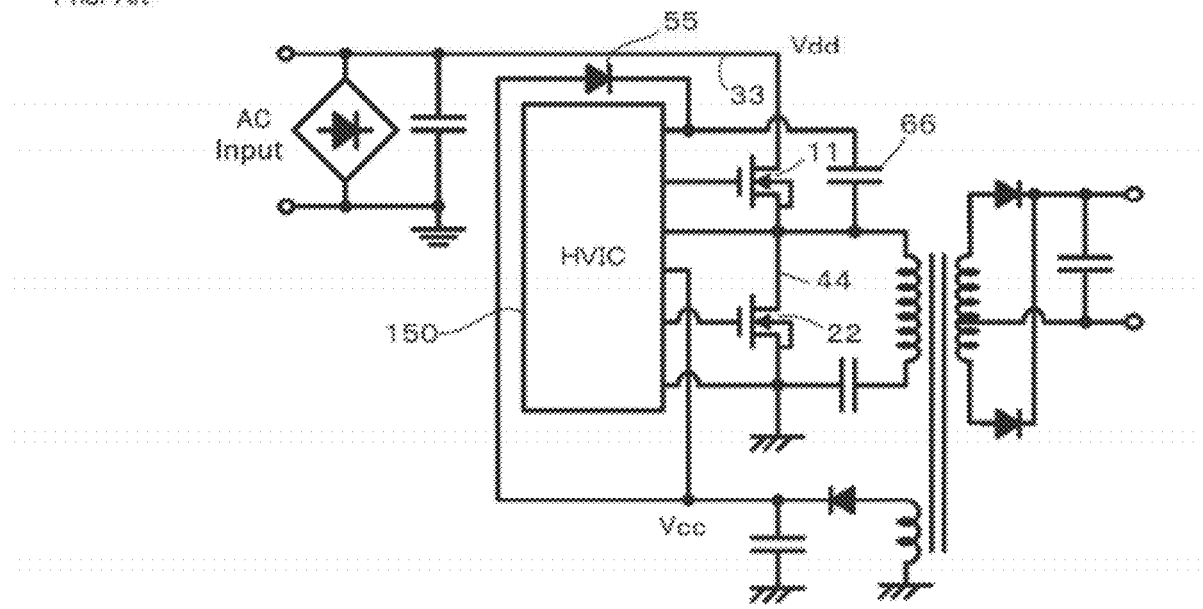
FIGS. 11(a) and 11(b) are circuit diagrams of an example of a high voltage power supply using a conventional HVIC.
Figure 11:
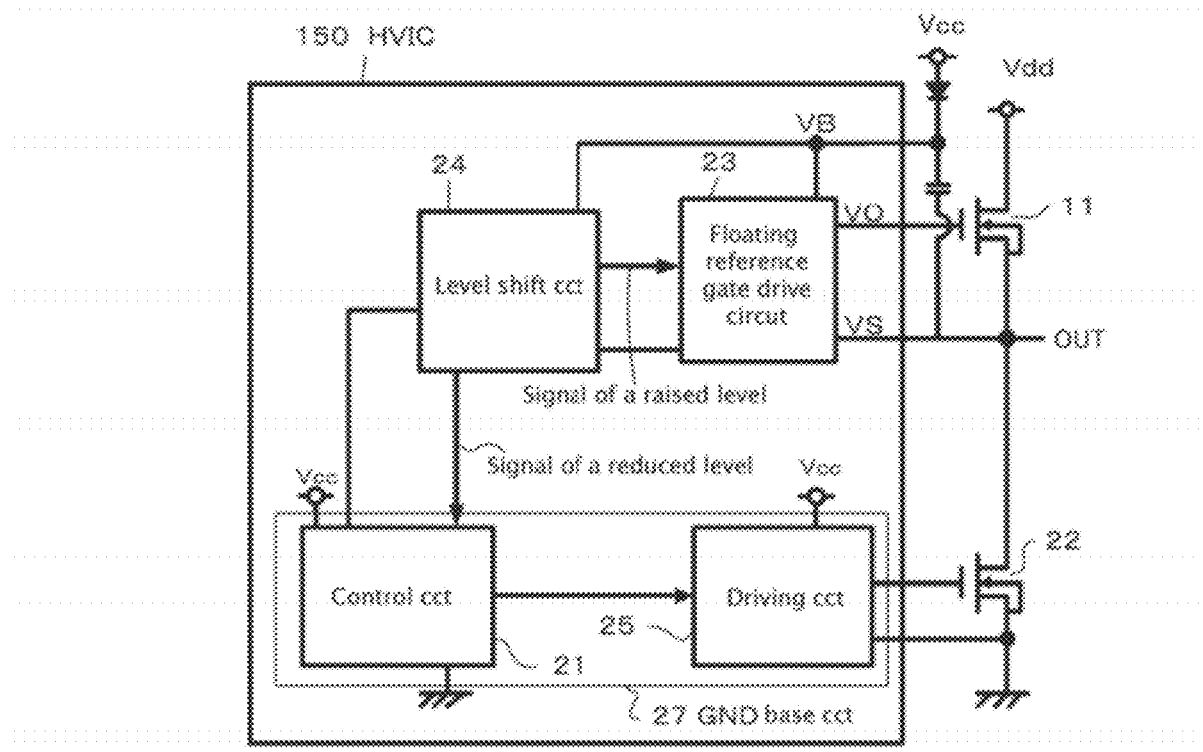
Figure 12:
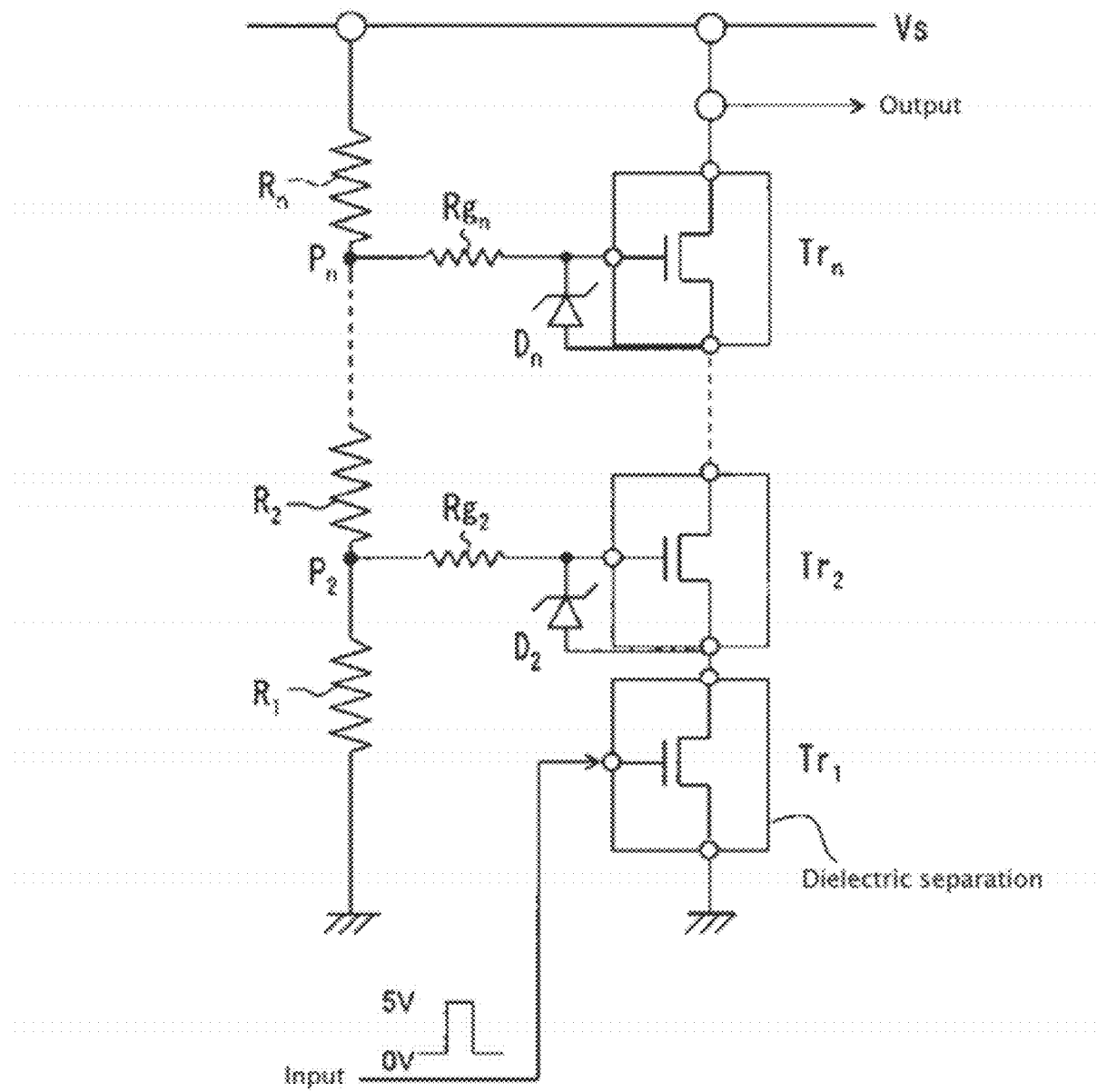
FIG. 12 is a basic equivalent circuit diagram of the semiconductor device disclosed in Patent Document 3.
Figure 13:
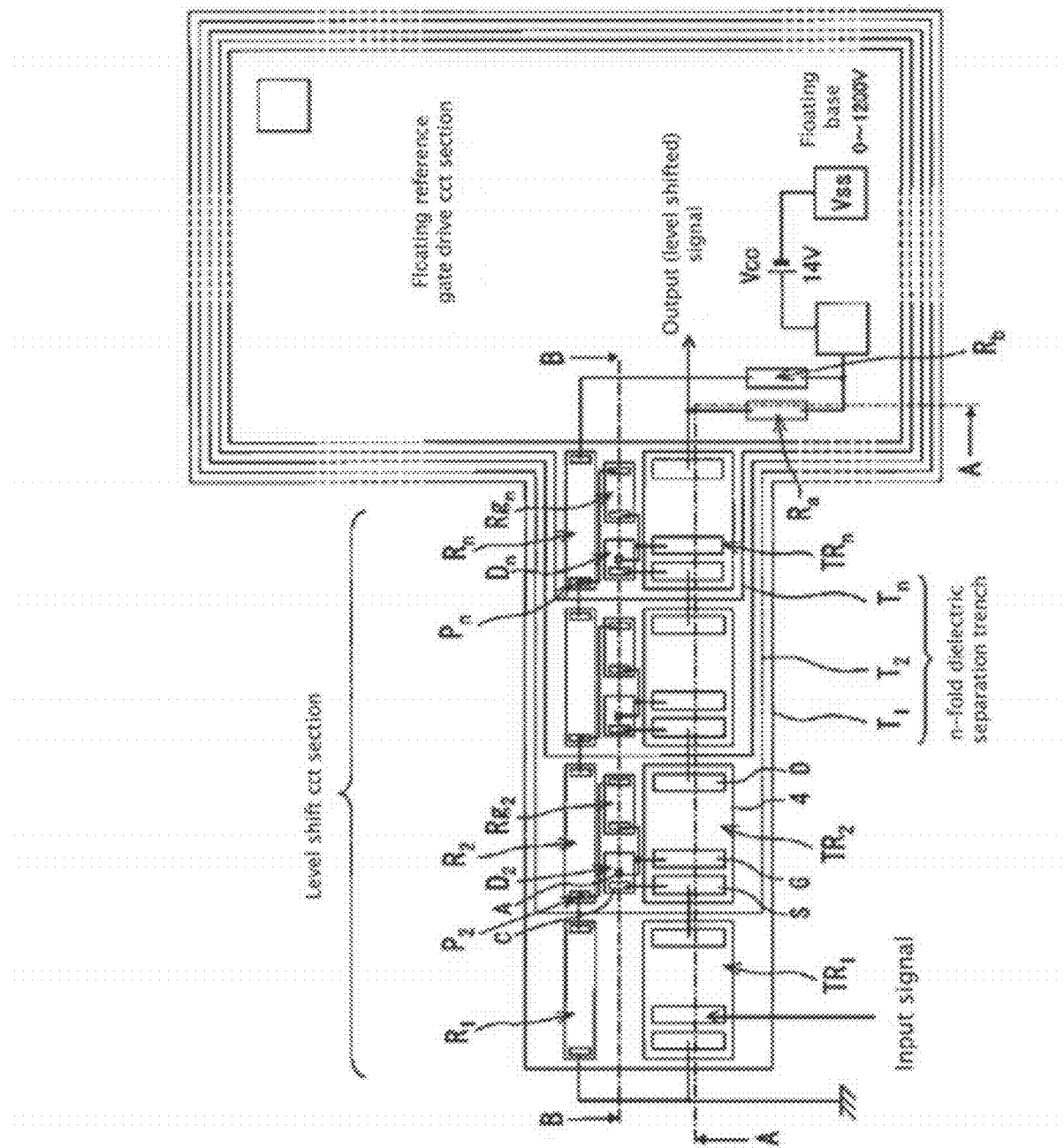
FIG. 13 is a schematic plan view showing arrangement of the construction elements shown in the circuit diagram of FIG. 12.
Figure 14:
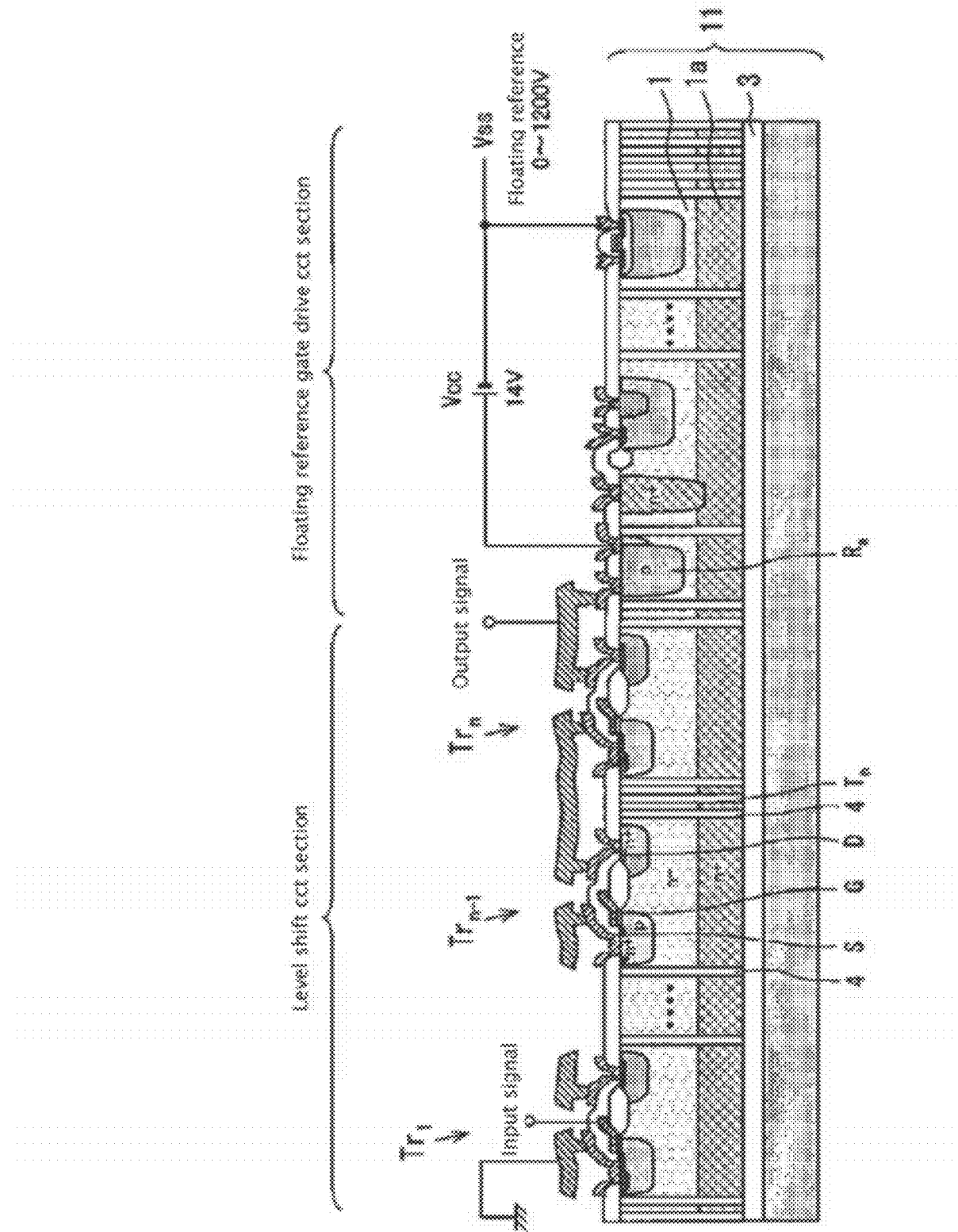
FIG. 14 is a sectional view cut along the line A-A in FIG. 13.
Figure 15:
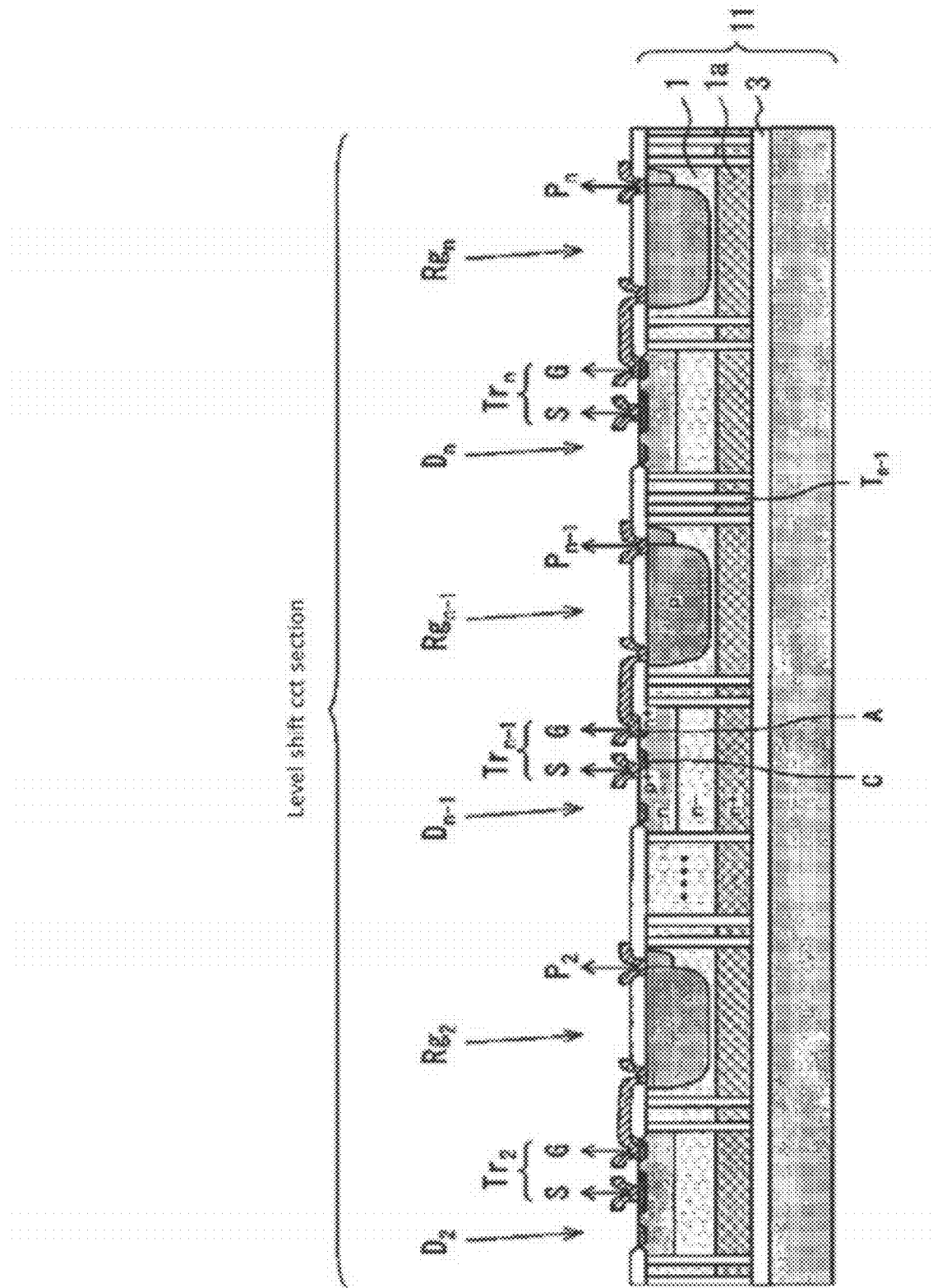
FIG. 15 is a sectional view cut along the line B-B in FIG. 13.
Figure 16:
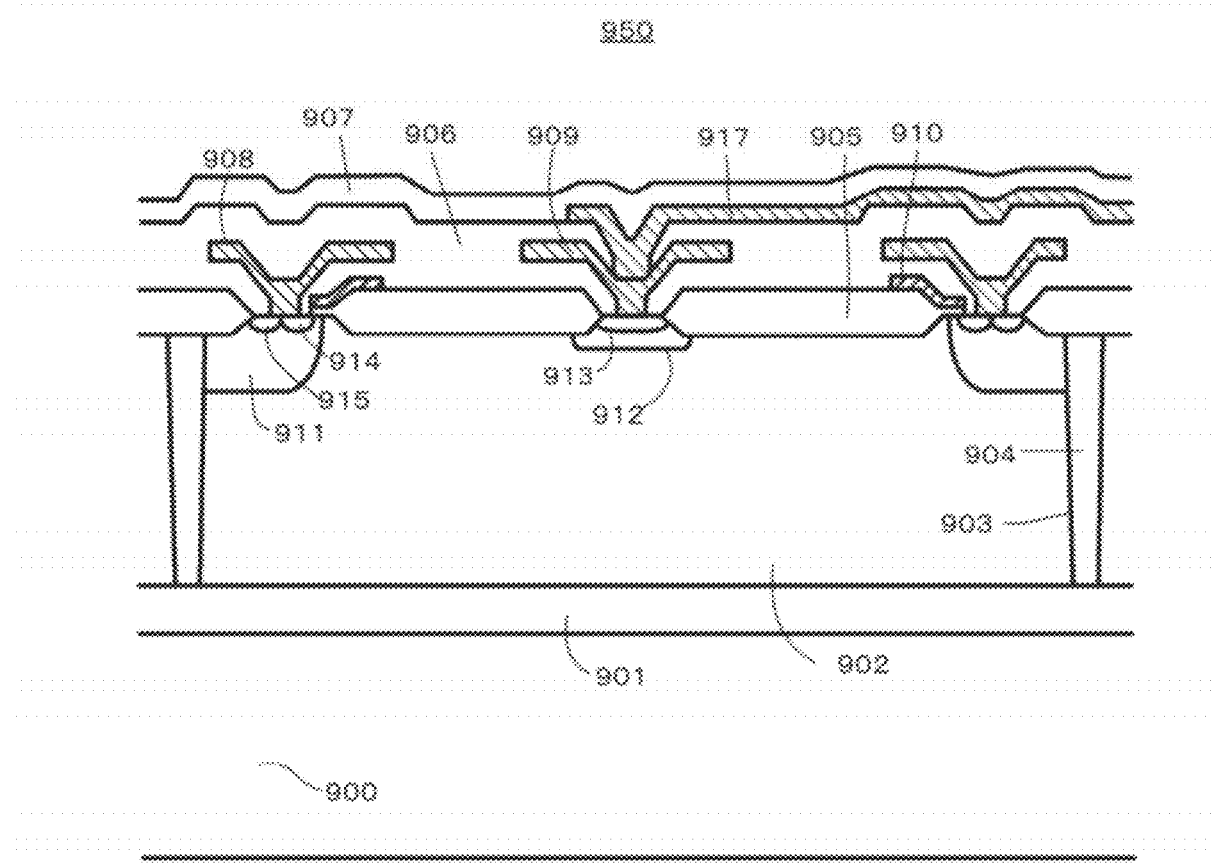
FIG. 16 is a sectional view of an essential part of a conventional high-voltage semiconductor device.

FIG. 10 is a sectional view of an essential part of another embodiment example of a high-voltage semiconductor device of the invention.

This second embodiment differs from the first embodiment in that an NMOSFET 304 is added between the first stage transistor 301 and the second stage transistor 302 to construct a three stage construction with three NMOSFETs connected in series.

The NMOSFET 304 is formed, similar to the second stage transistor 302, in a ring shaped planar configuration of a p type well diffusion layer 1111 reaching the embedded dielectric layer 200. The p type well diffusion layer 1111 isolates the NMOSFET 304 from the first stage transistor 301. In the surface region of the p type well diffusion layer 1111, a source n+ layer 1091 and a well pick up p+ layer 1101 are formed. A source electrode 1074 connected to the source n+ layer 1091 and the well pick up p+ layer 1101 is connected to the drain electrode 1072 of the first stage transistor 301. A drain n+ layer 1081 is formed in the surface region of the n– type semiconductor layer 101 apart from the p type well diffusion layer 1111. A gate electrode 1121 is provided over the source n+ layer 1091, the p type well diffusion layer 1111, and the drift drain region with an intervening dielectric film. A drain electrode 1073 in connection with the drain n+ layer 1081 is connected to the source electrode 1071 of the second stage transistor 302. A resistance element Rp5 is formed that is connected in series between the resistance element Rp2 and the resistance element Rp3 of the dividing potential resistance element 115 in a spiral configuration on the field oxide film 125. A threshold voltage Vth of the NMOSFET 304 is set at a value lower than that of the first stage transistor 301 positioned in the low potential side (the GND potential side), and can be the same value as of the second stage transistor 302. Undepicted other structures can be similar to those in the second stage transistor 302.

A high-voltage semiconductor device of this embodiment can enhance the source-drain withstand voltage as compared to the first embodiment.

Low ON voltage operation is possible as well because of a high withstand voltage of each stage of transistor like in the first embodiment. Still lower ON voltage can be achieved by setting the threshold voltages Vth of the NMOSFET 304 and the second stage transistor 302 to be lower than that of the first stage transistor 301. Thus, low voltage operation can be implemented in the circuit of the floating reference gate drive circuit region 305. A lower limit of the threshold voltage Vth of the first stage transistor 301 is restrained by setting of a threshold voltage Vth (normally 2 to 3 V) that avoids malfunction due to noises in a voltage of a gate input signal (for example Vin=5 V) outputted from the control circuit side, so the lower limit is around this value. However, the threshold voltages Vth of the NMOSFET 304 and the second stage transistor 302 only need to be set so as to ensure ON/OFF operation of the NMOSFET 304 and the second stage transistor 302, thus can be lowered to a value lower than the threshold voltage Vth of the first stage transistor 301. Consequently, by setting the threshold voltage Vth of the first stage transistor 301 at the highest of the three threshold voltages, an ON voltage of a high-voltage semiconductor device can be reduced.

The above description has been made on a high-voltage semiconductor device of the second embodiment having a three stage construction. However, four stage construction or five stage construction can be obtained by connecting two or three NMOSFETs in series between the first stage transistor 301 and the second stage transistor 302 in the first embodiment. More stages of semiconductor device can be implemented by increasing the number of NMOSFETs 304 connected in series.

What is claimed is:

1. A high-voltage semiconductor device comprising:
   a first conductivity type semiconductor region formed on a dielectric layer; and
   n transistors formed in the first conductivity type semiconductor region in series connection with one another, n being two or more, wherein;
   a source electrode of a first stage transistor of the n transistors is connected to a low potential side of the semiconductor device and a drain electrode of a n-th stage transistor is connected to a high potential side of the semiconductor device;
   the transistors nearer to the high potential side are surrounded by the transistors nearer to the low potential side; and
   a gate terminal of the first stage transistor is a signal input terminal, and a drain terminal of the n-th transistor is a signal output terminal;
   wherein each transistor of the n transistors comprises a source layer formed in a surface region of the semiconductor region in a ring shape, a drain layer formed in the surface region of the semiconductor region inside the source layer with a predetermined distance from the source layer, a source electrode in connection with the source layer, a drain electrode in connection with the drain layer, and a connection wiring that connects the drain electrode of a preceding stage transistor to the source electrode of a following stage transistor, and n resistance elements formed in series connection with one another between the drain electrode of the n-th stage transistor and the low potential side, a low potential side of each resistance element being connected to the gate electrode of each stage of transistor.

2. The high-voltage semiconductor device according to claim 1, wherein a planar shape of a periphery of each transistor of the n transistors is a circle or an ellipse.

3. The high-voltage semiconductor device according to claim 1, wherein the semiconductor region is formed on a support substrate interposing an embedded dielectric layer and partitioned by dielectric isolation from adjacent regions with trenches having a planar shape of a ring and containing buried dielectric substance; and
   the dielectric layer is the embedded dielectric layer.

4. A high-voltage semiconductor device comprising:
   a first conductivity type semiconductor region formed on a dielectric layer; and
   n transistors formed in the first conductivity type semiconductor region in series connection with one another, n being two or more, wherein;
   a source electrode of a first stage transistor of the n transistors is connected to a low potential side of the semiconductor device and a drain electrode of a n-th stage transistor is connected to a high potential side of the semiconductor device;
   the transistors nearer to the high potential side are surrounded by the transistors nearer to the low potential side; and
   a gate terminal of the first stage transistor is a signal input terminal, and a drain terminal of the n-th transistor is a signal output terminal;
   wherein each stage of n transistors comprises:
   a well diffusion layer of a second conductivity type formed in a ring shape in the semiconductor region;
   a source layer of the first conductivity type selectively formed in a ring shape in a surface region of the well diffusion region;
   a drain layer of the first conductivity type formed in the surface region of the semiconductor region inside the source layer with a predetermined distance from the source layer;
   a gate electrode formed over a surface of the well diffusion layer between the semiconductor region and the source layer interposing a dielectric insulation film;
   a source electrode in connection with the source layer and the well diffusion layer, and
   a drain electrode in connection with the drain layer;
   the high-voltage semiconductor device further comprising a connection wiring that connects the drain electrode of each of the first stage to (n−1)-th stage transistors to the source electrode of an adjacent inside transistor.

5. The high-voltage semiconductor device according to claim 4, wherein a threshold voltage of the first stage transistor is higher than that of any other stages of transistor.

6. The high-voltage semiconductor device according to claim 4, further comprising a drain pad in connection with the drain electrode of the n-th stage transistor.

7. The high-voltage semiconductor device according to claim 4, further comprising n resistance elements formed in series connection with one another between the drain layer of the n-th stage transistor and the low potential side, a low potential side of the each stage of resistance element being in connection with the gate electrode of the stage of transistor.

8. The high-voltage semiconductor device according to claim 4, wherein the well diffusion layer of at least one of the n transistors reaches the embedded dielectric layer.

9. The high-voltage semiconductor device according to claim 6, further comprising a floating reference gate drive circuit region surrounded by a trench reaching the embedded base region different from the tranches, in another region of the semiconductor region of the semiconductor layer, and an electrode pad formed on the floating reference gate drive circuit region, the electrode pad being connected to the drain pad with a bonding wire.

10. The high-voltage semiconductor device according to claim 4, wherein the semiconductor region is formed on a support substrate interposing an embedded dielectric layer and partitioned by dielectric isolation from adjacent regions with trenches having a planar shape of a ring and containing buried dielectric substance; and the dielectric layer is the embedded dielectric layer.

* * * * *